(12) United States Patent
Lee

(10) Patent No.: US 11,322,570 B2
(45) Date of Patent: May 3, 2022

(54) DISPLAY DEVICE WITH THROUGH-HOLE

(71) Applicant: LG Display Co., Ltd., Seoul (KR)

(72) Inventor: Jinsuk Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 29 days.

(21) Appl. No.: 16/717,379

(22) Filed: Dec. 17, 2019

(65) Prior Publication Data

US 2020/0212159 A1    Jul. 2, 2020

(30) Foreign Application Priority Data

Dec. 28, 2018 (KR) .......................... 10-2018-0173120

(51) Int. Cl.
*H01L 27/32* (2006.01)
*H01L 51/52* (2006.01)

(52) U.S. Cl.
CPC ........ *H01L 27/3276* (2013.01); *H01L 27/326* (2013.01); *H01L 51/5237* (2013.01)

(58) Field of Classification Search
CPC .......................... H01L 27/3276; H01L 27/326
See application file for complete search history.

(56) References Cited

U.S. PATENT DOCUMENTS

2017/0162637 A1\* 6/2017 Choi .................... G09G 3/3225
2018/0061722 A1\* 3/2018 Byun .................. H01L 27/3246

FOREIGN PATENT DOCUMENTS

KR    10-2016-0149599 A    12/2016

\* cited by examiner

*Primary Examiner* — Moazzam Hossain
*Assistant Examiner* — Stanetta D Isaac
(74) *Attorney, Agent, or Firm* — Birch, Stewart, Kolasch & Birch, LLP

(57) ABSTRACT

A display device with a through-hole that can prevent external moisture or oxygen from permeating into a light emitting element. The display device with a through-hole includes a substrate including a display area in which pixels are disposed and a non-display area surrounding the display area, and further including a through-hole in the display area, a first dam surrounding the through-hole, a first conductive line provided along the first dam between the first dam and the pixels, and a second conductive line provided along the first dam between the first dam and the through-hole.

19 Claims, 10 Drawing Sheets

DISPLAY DEVICE WITH THROUGH-HOLE

CROSS-REFERENCE TO RELATED APPLICATIONS

This application claims priority under 35 U.S.C. § 119(a) to Korean Patent Application No. 10-2018-0173120, filed in the Republic of Korea on Dec. 28, 2018, which is hereby expressly incorporated by reference into the present application.

BACKGROUND

Field of the Disclosure

The present disclosure relates to a display device with a through-hole that displays an image.

Discussion of the Related Art

With advancement in information-oriented societies, demands for display devices that display an image have increased in various types. Recently, various display devices including electroluminescence display devices, such as a liquid crystal display (LCD) device, a plasma display panel (PDP) device, an organic light emitting display (OLED) device and a quantum dot light emitting display (QLED), have been widely utilized.

An OLED device and a QLED device among such display devices employ a spontaneous emission system, have a viewing angle, a contrast ratio, and the like which are more excellent than an LCD device. Further, they can be decreased in weight and thickness and are advantageous in power consumption because a separate backlight is not required. An OLED device can be driven with a low DC voltage, has a high response speed, and has low manufacturing costs.

An OLED device includes pixels each including a light emitting element. The light emitting elements, however, can easily deteriorate due to external factors such as external moisture and oxygen.

SUMMARY

The present disclosure provides a display device with a through-hole that can prevent external moisture or oxygen from permeating into a light emitting element.

A display device with a through-hole according to an embodiment of the present disclosure includes a substrate that includes a display area in which pixels are disposed and a non-display area surrounding the display area, a first dam that surrounds a through-hole, a first conductive line that is formed along the first dam between the first dam and the pixels, and a second conductive line that is formed along the first dam between the first dam and the through-hole. The first conductive line and the second conductive line are electrically insulated from electrodes which are formed on the substrate.

According to the present disclosure, since a groove is formed in the inner dam, the light emitting layer and the second electrode are cut off. Accordingly, according to the present disclosure, it is possible to prevent moisture that might have permeated to the side surfaces of the light emitting layer and the second electrode, which are exposed from a through-hole, from diffusing into neighboring pixels disposed near the through-hole.

According to the present disclosure, since the first conductive line and the second conductive line are formed on the first side and the second side of the inner dam, respectively, it is possible to easily ascertain whether the light emitting layer and the second electrode have been cut off using the conductive lines. Accordingly, it is possible to improve reliability of products.

Advantageous effects of the present disclosure are not limited to the above-mentioned advantageous effects and other advantageous effects which have not been mentioned above will be apparently understood by those skilled in the art from the following description.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
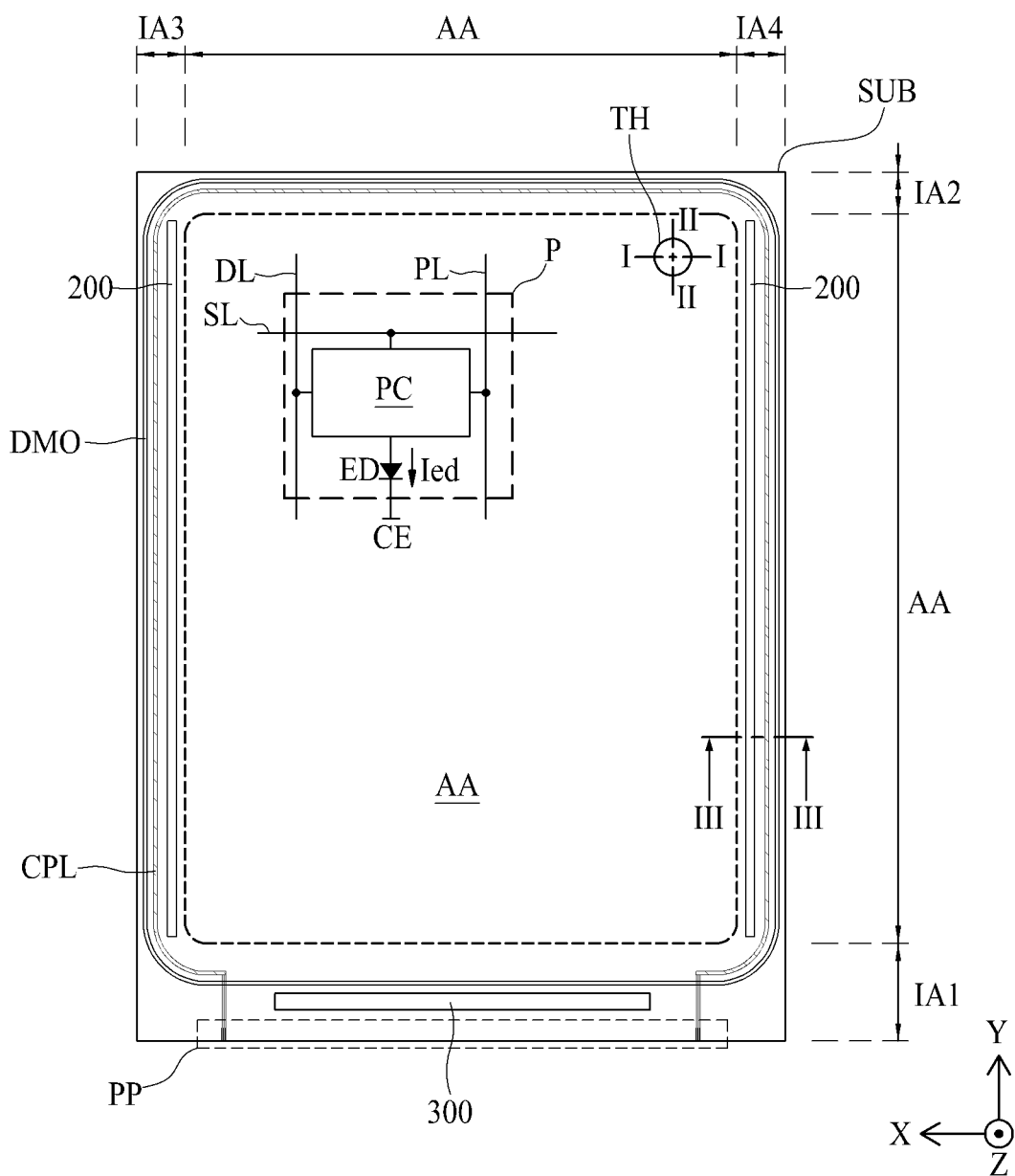
FIG. 1 is a plan view schematically illustrating a display device according to an embodiment of the present disclosure.

Advantages and features of the present disclosure and implementation methods thereof will be clarified through following embodiments which are described below with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a positional relationship, for example, when a position relation between two parts is described as 'on-', 'over-', 'under-' and 'next-', one or more other parts can be disposed between the two parts unless 'just' or 'direct' is used.

In describing a temporal relationship, for example, when the temporal order is described as 'after-' 'subsequent-' 'next-', and 'before-' a case which is not continuous can be included unless 'just' or 'direct' is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

An "X-axis direction," a "Y-axis direction," and a "Z-axis direction" should not be construed as a geometric relationship in which they are perpendicular to each other and mean that they have broad directivity within the scope in which elements of the present disclosure work functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, exemplary embodiments of the present disclosure will be described in detail with reference to the accompanying drawings.

FIG. 1 is a plan view schematically illustrating a display device according to an embodiment of the present disclosure. All the components of the display device according to all embodiments of the present disclosure are operatively coupled and configured.

Referring to FIG. 1, the display device according to the embodiment of the present disclosure includes a substrate SUB, pixels P, common power supply lines CPL, an outer dam DMO, driving units PP, 200, and 300, and a through-hole TH.

The substrate SUB can be a plastic film, a glass substrate, or a silicon wafer substrate which is formed through a semiconductor process. The substrate SUB can be formed of a transparent material or can be formed of an opaque material.

The display device according to an embodiment of the present disclosure can employ a top emission system in which emitted light is discharged to the top, but is not limited thereto. When the display device according to an embodiment of the present disclosure employs the top emission system in which emitted light is discharged to the top side, the substrate SUB can be formed of an opaque material in addition to a transparent material. On the other hand, when the display device according to an embodiment of the present disclosure employs a bottom emission system, the substrate SUB can be formed of a transparent material.

The substrate SUB two-dimensionally has a quadrangular shape, a quadrangular shape of which corners are rounded with a predetermined radius of curvature, or a non-quadrangular shape having at least six sides. Here, the substrate SUB having a non-quadrangular shape includes at least one protruding part or at least one notched part.

The substrate SUB can be partitioned into a display area AA and a non-display area IA. The display area AA is provided in a substantially middle part of the substrate SUB and is defined as an area for displaying an image. For example, the display area AA has a quadrangular shape, a quadrangular shape of which corners are rounded with a predetermined radius of curvature, or a non-quadrangular shape having at least six sides. Here, the display area AA having a non-quadrangular shape includes at least one protruding part or at least one notched part.

The non-display area IA is provided at edges of the substrate SUB to surround the display area AA and is defined as an area in which an image is not displayed or a circumferential area. The non-display area IA includes a first non-display area IA1 that is provided at a first edge of the substrate, a second non-display area IA2 that is provided at a second edge of the substrate SUB which is parallel to the first non-display area IA1, a third non-display area IA3 that is provided at a third edge of the substrate SUB, and a fourth non-display area IA4 that is provided at a fourth edge of the substrate SUB which is parallel to the third non-display area IA3. For example, the first non-display area IA1 can be an upper (or lower) edge area of the substrate SUB, the second non-display area IA2 can be a lower (or upper) edge area of the substrate SUB, the third non-display area IA3 can be a left (or right) edge area of the substrate SUB, and the fourth non-display area IA4 can be a right (or left) edge area of the substrate SUB, but the present disclosure is not limited thereto.

The pixels P are disposed in the display area AA of the substrate SUB. For example, a plurality of pixels P can be disposed in a matrix in the display area AA of the substrate SUB. The pixels P are disposed in areas which are defined by scan lines SL, data lines DL, and pixel driving power supply lines PL, respectively.

The scan lines SL extend in a first direction X and are disposed at predetermined intervals in a second direction Y crossing the first direction X. The display area AA of the substrate SUB includes a plurality of scan lines SL that are parallel to each other in the first direction X and are separated from each other in the second direction Y. Here, the first direction X is defined as a horizontal direction of the substrate SUB and the second direction Y is defined as a vertical direction of the substrate SUB, but the present disclosure is not limited thereto and can be defined on the contrary thereto.

The data lines DL extend in the second direction Y and are disposed at predetermined intervals in the first direction X. The display area AA of the substrate SUB includes a plurality of data lines DL that are parallel to the second direction Y and are separated from each other in the first direction X.

The pixel driving power supply lines PL are disposed on the substrate SUB to be parallel to the data lines DL. The display area AA of the substrate SUB includes a plurality of pixel driving power supply lines PL that are parallel to the data lines DL. Selectively, the pixel driving power supply lines PL can be disposed to be parallel to the scan lines SL.

One unit pixel (e.g., pixel P) includes a red subpixel, a green subpixel, and a blue subpixel, but is not limited thereto. One unit pixel can further include a white subpixel, or can include a different combination of subpixels.

Each pixel P includes a pixel circuit PC that is electrically connected to the corresponding scan line SL, the corresponding data line DL, and the corresponding pixel driving power supply line PL and a light emitting element ED that is electrically connected to the pixel circuit PC.

The pixel circuit PC controls a current Ted flowing from the pixel driving power supply line PL to the light emitting element ED on the basis of a data voltage which is supplied from the corresponding data line DL in response to a scan signal which is supplied form at least one corresponding scan line SL.

Each light emitting element ED emits light with luminance corresponding to the data current Ted in response to the data current Ted which is supplied from the pixel circuit PC. In this case, the data current Ted flows from the pixel driving power supply line PL to the common power supply line CPL via the driving transistor and the light emitting element ED.

The common power supply line CPL is disposed in the non-display area IA of the substrate SUB and is electrically connected to a second electrode CE disposed in the display area AA. For example, the common power supply line CPL is disposed along the second to fourth non-display areas IA2, IA3, and IA4 which are adjacent to the display area AA of the substrate SUB with a constant line width, and surrounds parts of the display area AA other than the part adjacent to the first non-display area IA1 of the substrate SUB. One end of the common power supply line CPL is disposed on one side of the first non-display area IA1 and the other end of the common power supply line CPL is disposed on the other side of the first non-display area IA1. One end and the other end of the common power supply line CPL are disposed to surround the second to fourth non-display areas IA2, IA3, and IA4. Accordingly, the common power supply line CPL has two-dimensionally a "n-shape" in which one side corresponding to the first non-display area IA1 of the substrate SUB is open.

A driving unit according to an embodiment of the present disclosure includes a pad part PP, a gate driving circuit 200, and a driving integrated circuit 300.

The pad part PP includes a plurality of pads which are provided in the non-display area IA of the substrate SUB. For example, the pad part PP can include a plurality of common power supply pads, a plurality of data input pads, a plurality of power supply pads, and a plurality of control signal input pads which are provided in the first non-display area IA1 of the substrate SUB.

The gate driving circuit 200 is provided in the third non-display area IA3 and/or the fourth non-display area IA4 of the substrate SUB and is connected to the scan lines SL provided in the display area AA in a one-to-one correspondence manner. The gate driving circuit 200 is formed as an integrated circuit in the third non-display area IA3 and/or the fourth non-display area IA4 of the substrate SUB in the same process as a process of manufacturing the pixels P, for example, a process of manufacturing the transistors. The gate driving circuit 200 drives a plurality of scan lines SL in a predetermined order by generating a scan signal on the basis of a gate control signal supplied from the driving integrated circuit 300 and outputting the generated scan signal in a predetermined order. For example, the gate driving circuit 200 can include a shift register.

An outer dam DMO is provided in the first non-display area IA1, the second non-display area IA2, the third non-display area IA3, and the fourth non-display area IA4 of the substrate SUB and has a closed curve structure surrounding the display area AA.

For example, the outer dam DMO is disposed outside the common power supply line CPL and is located in the outermost part on the substrate SUB. The pad part PP and the driving integrated circuit 300 are preferably disposed in an area outside the outer dam DMO.

The outer dam DMO is disposed in the outermost part in FIG. 1, but the present disclosure is not limited thereto. For example, the outer dam DMO can be disposed between the common power supply line CPL and the gate driving circuit 200. For example, the outer dam DMO can be disposed between the display area AA and the driving integrated circuit 300.

The driving integrated circuit 300 is mounted in a chip mounting area which is defined in the first non-display area IA1 of the substrate SUB through a chip mounting (or bonding) process. Input terminals of the driving integrated circuit 300 are directly connected to the pad part PP and thus a plurality of data lines DL provided in the display area AA are electrically connected to a plurality of pixel driving power supply lines PL. The driving integrated circuit 300 receives various powers, a timing synchronization signal, and digital image data from a display driving circuit unit (or a host circuit) via the pad part PP, generates gate control signals on the basis of the timing synchronization signal, controls driving of the gate driving circuit 200, converts the digital image data into analog pixel data voltages, and supplies the analog pixel data voltages to the corresponding data lines DL.

The through-hole TH physically penetrates the display device. For example, the through-hole TH can be formed to penetrate only a display panel of the display device. In this case, a structured in which a polarization film or cover glass which is bonded to the top surface of the display panel is not penetrated and the through-hole TH is covered can be provided. When a through-hole TH for transmitting light such as a camera hole or an optical sensor hole is provided, the through-hole TH can penetrate only the display panel and not penetrate the polarization film or the cover glass. For example, when an additional device penetrating the whole display device is intended to be provided, a through-hole TH that penetrates the display panel and an optical film and a cover glass bonded thereon can be provided.

Since display elements are not disposed in the through-hole TH, the through-hole TH is disposed in the non-display area IA. In this case, since a width or a length of the display area AA corresponding to a width or a length of the through-hole TH as well as the area of the through-hole TH decreases, an area ratio of the display area AA to the display panel also decreases. In the present disclosure, the through-hole TH is disposed in the display area AA. Accordingly, since display elements are not disposed in only an area associated with the through-hole TH in the display area AA and display elements are disposed around the through-hole TH, it is possible to maximize the area ratio of the display area AA to the display panel.

Hereinafter, structural features of a through-hole according to an example of the present disclosure will be described in more detail with reference to FIG. 2.

Figure 2:
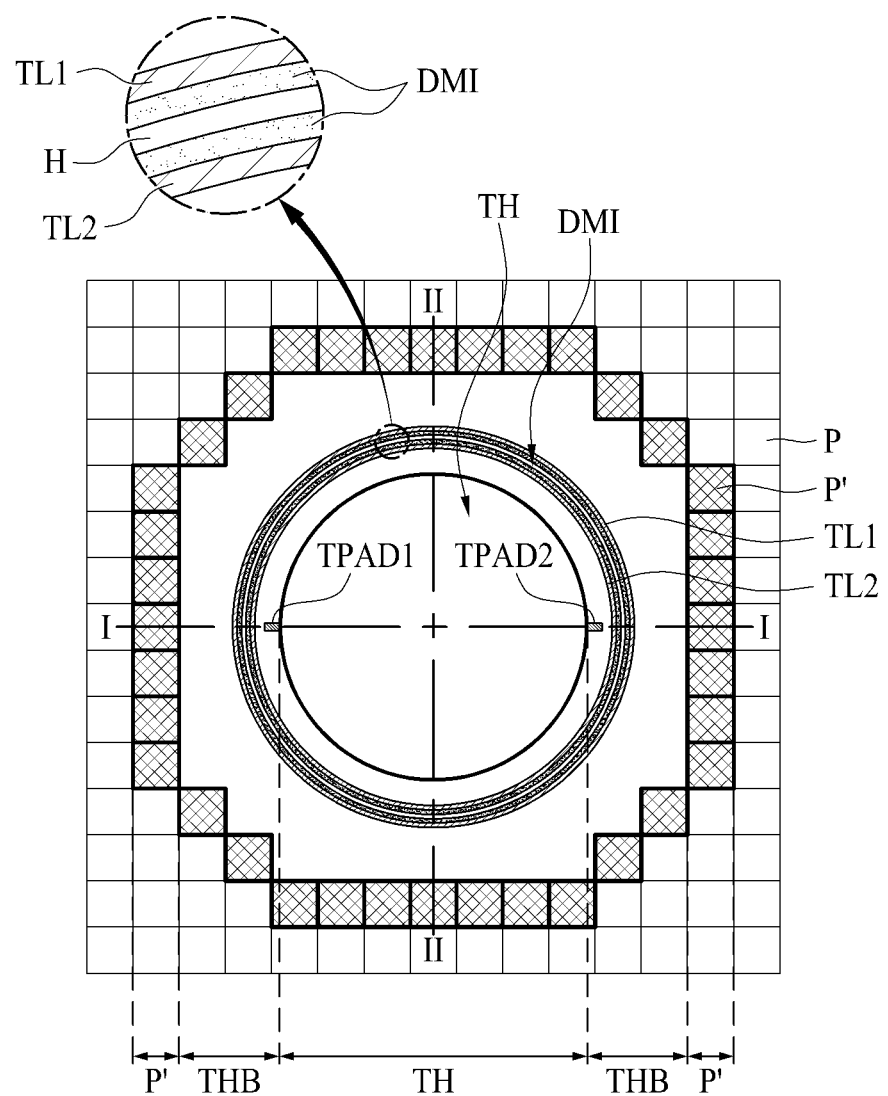
FIG. 2 is an enlarged plan view illustrating a structure of a through-hole which is disposed in a display area of a display device according to an embodiment of the present disclosure.

FIG. 2 is an enlarged plan view illustrating a structure of a through-hole which is disposed in the display area of the display device according to an embodiment of the present disclosure.

Referring to FIG. 2, a through-hole TH is disposed in the display area AA. Pixels P are disposed around the through-hole TH. Pixels P which are disposed to be closest to the through-hole TH out of the pixels P can be defined as neighboring pixels P'. A part between the neighboring pixels P' and the through-hole TH is defined as a hole boundary part THB.

An inner dam DMI is disposed in the hole boundary part THB. The inner dam DMI is disposed between the through-hole TH and the neighboring pixels P'. The inner dam DMI has a closed curve shape surrounding the through-hole TH to correspond to the shape of the through-hole TH. The inner dam DMI can have a closed curve shape different from that of the through-hole TH or can have a closed curve shape with the same shape but a different size. For example, the inner dam DMI and the through-hole TH can be concentrically separated from each other with a constant gap therebetween.

Hereinafter, a sectional structure of the display device according to an embodiment of the present disclosure will be described with reference to FIGS. 3 to 6.

Figure 3:
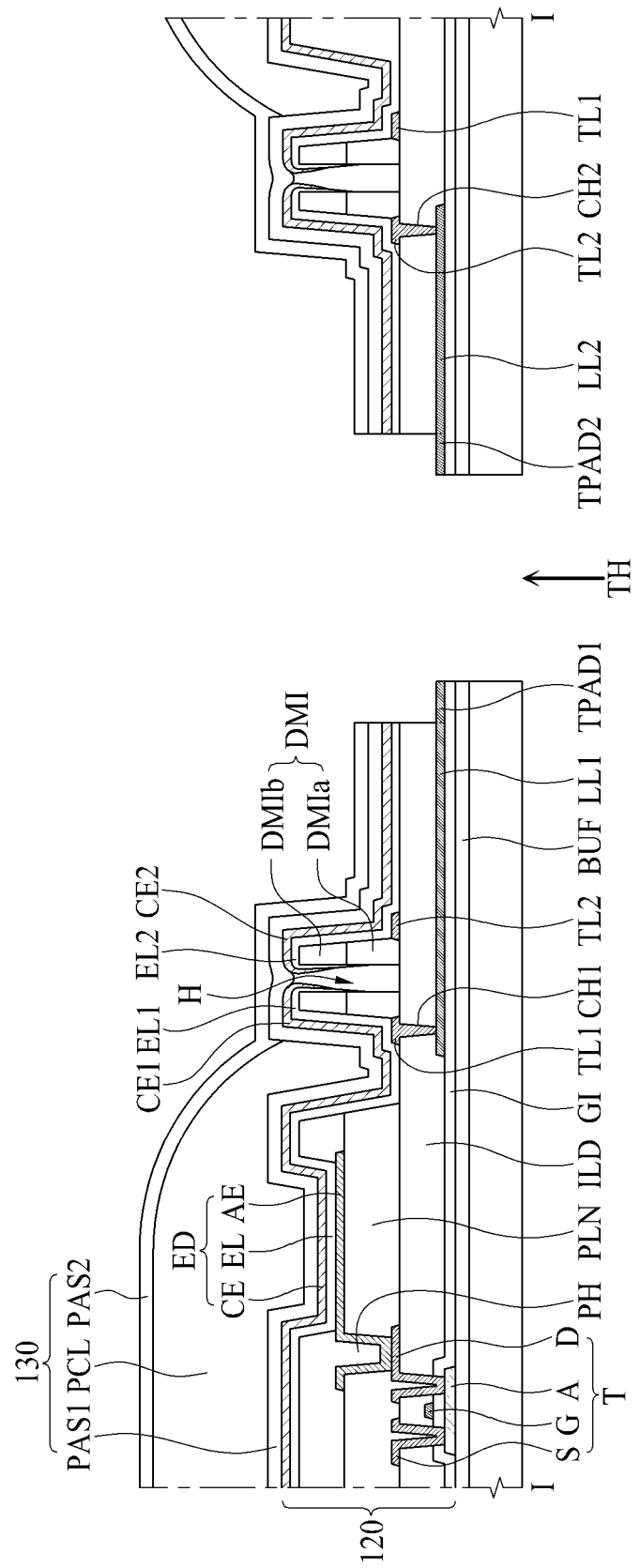
FIG. 3 is a sectional view illustrating an exemplary sectional structure taken along line I-I in FIG. 1.
Figure 4:
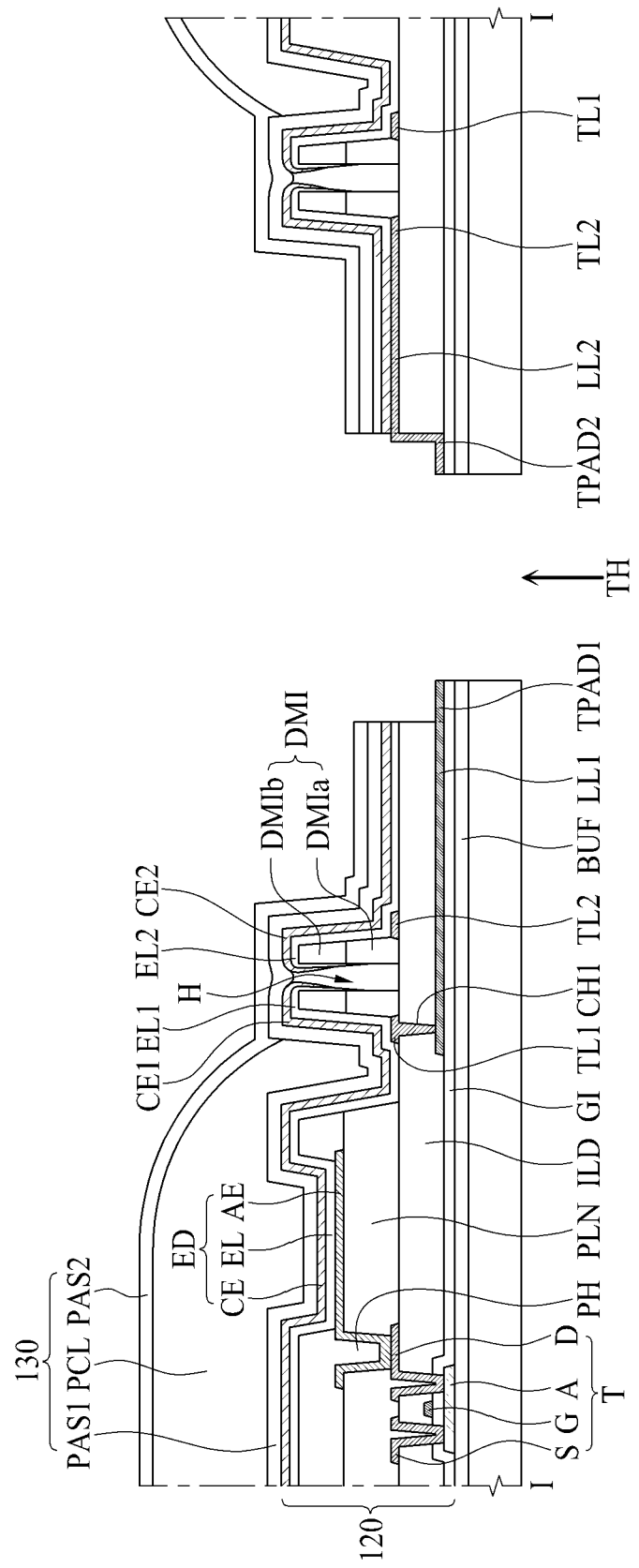
FIG. 4 is a sectional view illustrating another exemplary sectional structure taken along line I-I in FIG. 1.
Figure 5:
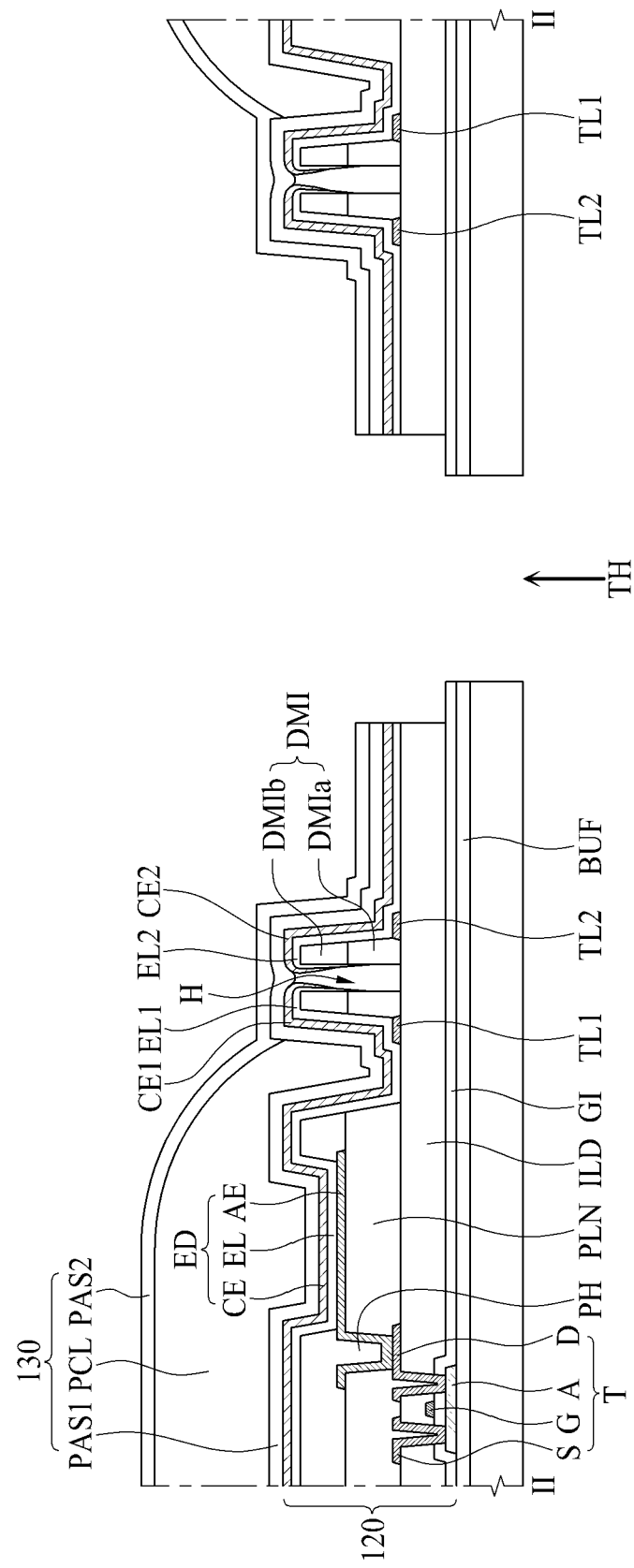
FIG. 5 is a sectional view illustrating an exemplary sectional structure taken along line II-II in FIG. 1.
Figure 6:
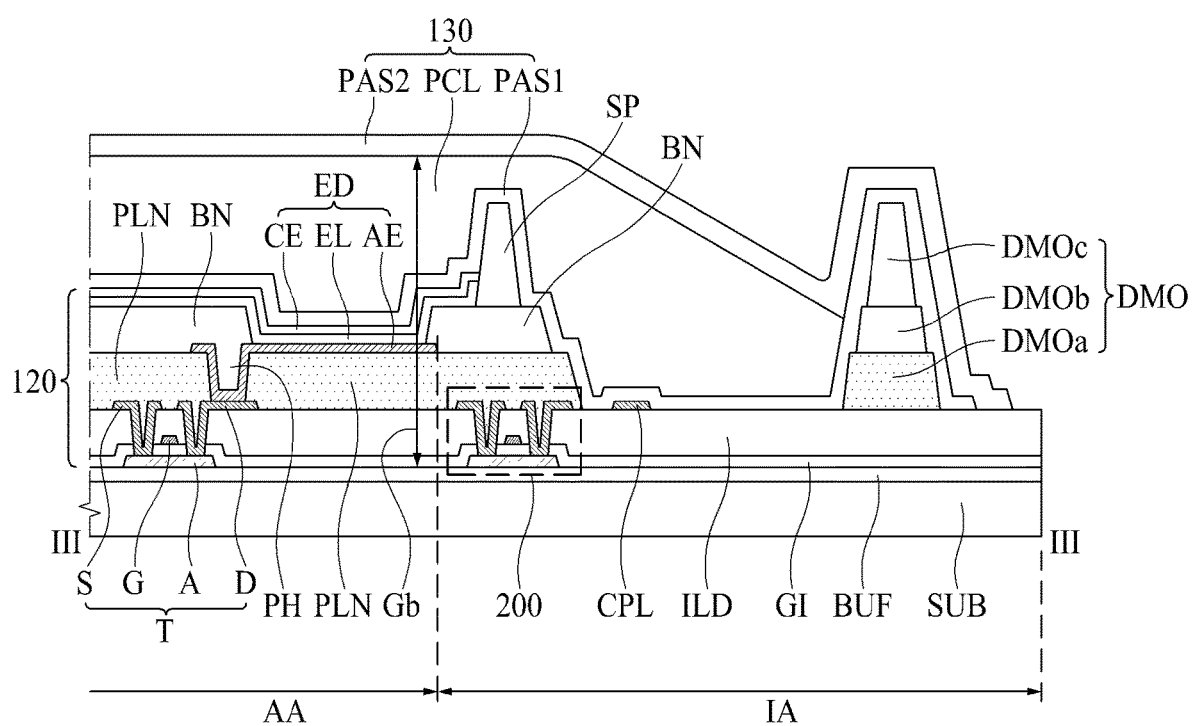
FIG. 6 is a sectional view illustrating an exemplary sectional structure taken along line III-III in FIG. 1.

FIG. 3 is a sectional view illustrating an exemplary sectional structure taken along line I-I in FIG. 1. FIG. 4 is a sectional view illustrating another exemplary sectional structure taken along line I-I in FIG. 1. FIG. 5 is a sectional view illustrating an exemplary sectional structure taken along line II-II in FIG. 1. FIG. 6 is a sectional view illustrating an exemplary sectional structure taken along line III-III in FIG. 1.

Referring to FIGS. 3 to 6, a display device according to an embodiment of the present disclosure includes a substrate SUB, a buffer film BUF, a pixel array layer 120, an encapsulation layer 130, an inner dam DMI, a first conductive line TL1, a second conductive line TL2, a first link line LL1, a second link line LL2, a first test pad TPAD1, a second test pad TPAD2, and a through-hole TH.

The substrate SUB includes a display area AA and a non-display area IA that surrounds the display area AA. The substrate SUB can be a plastic film, a glass substrate, or a silicon wafer substrate which is formed through a semiconductor process. The substrate SUB can be formed of a transparent material or can be formed of an opaque material. The substrate SUB can be a flexible substrate or a rigid substrate.

The buffer film BUF is deposited on the top surface of the substrate SUB. The buffer film BUF is provided on the top surface of the substrate SUB to prevent moisture from permeating the pixel array layer 120 via the substrate SUB which is weak to moisture. For example, the buffer film BUF can be formed of a silicon oxide film (SiOx), a silicon nitride film (SiNx), a silicon oxynitride film (SiON), or a multi-layered film thereof. The buffer film BUF can be omitted.

The pixel array layer 120 is stacked on the buffer film BUF. The pixel array layer 120 includes a circuit element layer, a planarization layer PLN, a bank BN, a spacer SP, and a light emitting element ED.

The circuit element layer is provided on the buffer film BUF. The circuit element layer includes a transistor T, a gate insulating film GI, and an interlayer insulating film ILD.

Here, the transistor T illustrated in FIGS. 3 to 5 can be a driving transistor that is electrically connected to the light emitting element ED.

The transistor T is provided on the substrate SUB or the buffer film BUF for each subpixel. The transistor T includes an active layer A, a gate electrode G, a source electrode S, and a drain electrode D.

The transistor T illustrated in FIGS. 3 to 5 has a top gate structure in which the gate electrode G is located above the active layer A, but the present disclosure is not limited thereto. For example, the transistor T can have a bottom gate structure in which the gate electrode G is located below the active layer A or a double gate structure in which the gate electrode G is located above and below the active layer A.

The active layer A is provided on the substrate SUB or the buffer film BUF. The active layer A is formed of a silicon-based semiconductor material, an oxide-based semiconductor material, or an organic-based semiconductor material and has a single-layered structure or a multi-layered structure. A light blocking layer for blocking external light which is incident on the active layer A can be additionally provided between the buffer film BUF and the substrate SUB.

The gate insulating film GI is provided on the active layer A to cover the active layer A. For example, the gate insulating film GI can be formed of a silicon oxide film (SiOx), a silicon nitride film (SiNx), a silicon oxynitride film (SiON), or a multi-layered film thereof.

The gate electrode G is provided on the gate insulating film GI to overlap the active layer A. The gate electrode G is provided along with the scan lines SL. For example, the gate electrode G is formed of a single layer including one of molybdenum (Mo), aluminum (Al), chromium (Cr), gold (Au), titanium (Ti), nickel (Ni), neodymium (Nd), and copper (Cu) or an alloy thereof or multiple layers thereof.

The interlayer insulating film ILD is provided on the gate electrode G to cover the gate electrode G. The interlayer insulating film ILD provides a flat surface to the gate electrode G and the gate insulating film GI.

The source electrode S and the drain electrode D are provided on the interlayer insulating film ILD to overlap the active layer A with the gate electrode G interposed therebetween. The source electrode S and the drain electrode D are provided along with the data lines DL, the pixel driving power supply lines PL, and the common power supply line CPL. For example, the source electrode S, the drain electrode D, the data lines DL, the pixel driving power supply lines PL, and the common power supply line CPL are formed through a process of patterning a source/drain electrode material at the same time.

The source electrode S and the drain electrode D are connected to the active layer A via contact holes that penetrate the interlayer insulating film ILD and the gate insulating film GI. The source electrode S and the drain electrode D are formed of a single layer including one of molybdenum (Mo), aluminum (Al), chromium (Cr), gold (Au), titanium (Ti), nickel (Ni), neodymium (Nd), and copper (Cu) or an alloy thereof or multiple layers thereof.

In this way, the driving transistor T provided in a pixel P of the substrate SUB constitutes a pixel circuit PC. The gate driving circuit 200 disposed in the fourth non-display area IA4 of the substrate SUB includes a transistor equal or similar to the driving transistor T provided in the pixel P.

The planarization layer PLN is provided on the transistor to flatten a stepped part due to the driving transistor T. For example, the planarization layer PLN is formed of an organic film such as an acryl resin, an epoxy resin, a phenolic resin, a polyamide resin, or a polyimide resin.

The planarization layer PLN can include a contact hole PH that exposes the source electrode S and the drain electrode D of the driving transistor provided in the pixel P.

The bank BN is disposed on the planarization layer PLN. The bank BN is provided to cover an end of a first electrode AE and to expose a part of the first electrode AE. Accordingly, the bank BN can prevent a problem that a current is concentrated on the end of the first electrode AE to decrease emission efficiency.

The bank BN defines an emission area in each subpixel. For example, an area of each subpixel in which the bank BN is not formed and from which the first electrode AE is exposed serves as an emission area. On the other hand, an area other than the emission area is defined as a non-emission area.

The bank BN can be formed of, for example, a silicon oxide film (SiOx), a silicon nitride film (SiNx), a silicon oxynitride film (SiON), or a multi-layered film thereof, but is not limited thereto. The bank BN can be formed of an organic film such as an acryl resin, an epoxy resin, a phenolic resin, a polyamide resin, or a polyimide resin.

The spacer SP is provided on the bank BN. The spacer SP can be formed of an organic film such as an acryl resin, an epoxy resin, a phenolic resin, a polyamide resin, or a polyimide resin. The spacer SP can be omitted.

Each light emitting element ED includes a first electrode AE, a light emitting layer EL, and a second electrode CE.

The first electrode AE is provided in patterns on the planarization layer PLN for each subpixel. The first electrode AE is connected to the driving transistor T. Specifically, the first electrode AE is electrically connected to the source electrode S or the drain electrode D of the driving transistor T via the contact hole PH penetrating the planarization layer PLN.

The first electrode AE can be formed of a metal material having high reflectance. For example, the first electrode AE can be formed in a multilayered structure such as a stacked structure (Ti/Al/Ti) of aluminum (Al) and titanium (Ti), a stacked structure (ITO/Al/ITO) of aluminum (Al) and ITO, an APC (Ag/Pd/Cu) alloy, and a stacked structure (ITO/APC/TIO) of an APC alloy and ITO or can be formed in a single-layered structure including one or an alloy of two or more selected from silver (Ag), aluminum (Al), molybdenum (Mo), gold (Au), magnesium (Mg), calcium (Ca), and barium (Ba).

The light emitting layer EL is provided on the first electrode AE, the bank BN, and the spacer SP. The light emitting layer EL includes a hole transporting layer, at least one light emitting layer, and an electron transporting layer. In this case, when a voltage is applied to the first electrode AE and the second electrode CE, holes and electrons move to the light emitting layer via the hole transporting layer and the electron transporting layer, respectively, and are combined in the light emitting layer to emit light.

The light emitting layer EL includes a red light emitting layer that emits red light, a green light emitting layer that emits green light, and a blue light emitting layer that emits blue light. The red light emitting layer, the green light emitting layer, and the blue light emitting layer can be provided in patterns on the first electrode AE for each subpixel. For example, a red light emitting layer is pattern-formed in a red pixel R, a green light emitting layer is pattern-formed in a green pixel G, and a blue light emitting layer is pattern-formed in a blue pixel B, but the present disclosure is not limited thereto.

Alternatively, the light emitting layer EL can be a white light emitting layer that emits white light. In this case, the light emitting layer EL can be a common layer which is provided commonly to the subpixels. The light emitting layer EL can be provided in a tandem structure of two or more stacks. Each stack can include a hole transporting layer, at least one light emitting layer, and an electron transporting layer.

A charge generating layer can be provided between the stacks. The charge generating layer includes an n-type charge generating layer that is located adjacent to a lower stack and a p-type charge generating layer that is provided on the n-type charge generating layer and is located adjacent to an upper stack. The n-type charge generating layer injects electrons to the lower stack, and the p-type charge generating layer injects holes to the upper stack. The n-type charge generating layer can be formed of an organic layer which is obtained by doping an organic host material with an alkali metal such as Li, Na, K, or Cs or an alkali earth metal such as Mg, Sr, Ba, or Ra. The p-type charge generating layer can be an organic layer which is obtained by doping an organic host material having hole transportability with a dopant.

The second electrode CE is provided on the light emitting layer EL. The second electrode CE can be a common layer which is provided commonly to the pixels P.

The second electrode CE can be formed of a transparent conductive material (TCO) such as ITO or IZO that can transmit light or a semi-transmissive conductive material such as magnesium (Mg), silver (Ag), or an alloy of magnesium (Mg) and silver (Ag). When the second electrode CE is formed of a semi-transmissive conductive material, emission efficiency can be increased by micro cavities. A capping layer can be provided on the second electrode CE.

The encapsulation layer 130 is provided on the pixel array layer 120. The encapsulation layer 130 includes at least one inorganic film and at least one organic film to prevent oxygen or moisture from permeating the light emitting element ED.

For example, the encapsulation layer 130 includes a first inorganic film PAS1, an organic film PCL, and a second inorganic film PAS2 on the organic encapsulation layer PCL. In this case, the first inorganic film PAS1 is provided to cover the second electrode CE. The organic film PCL is provided on the first inorganic film PAS1. The organic film PCL is preferably provided in a sufficient thickness such that particles are prevented from passing through the first inorganic film PAS1 and reaching the light emitting layer EL and the second electrode CE. The second inorganic film PAS2 is provided to cover the organic film PCL.

The first inorganic film PAS1 and the second inorganic film PAS2 serve to prevent permeation of moisture or oxygen. For example, the first inorganic film PAS1 and the second inorganic film PAS2 can be formed of an inorganic material such as silicon nitride, aluminum nitride, zirconium nitride, titanium nitride, hafnium nitride tantalum nitride, silicon oxide, aluminum oxide, or titanium oxide. The first inorganic film PAS1 and the second inorganic film PAS2 can be formed using a chemical vapor deposition (CVD) process or an atomic layer deposition (ALD) process.

The organic film PCL can be formed of an organic material such as an acryl resin, an epoxy resin, a phenolic resin, a polyamide resin, or a polyimide resin. The organic film PCL can be formed using a vapor deposition process, a printing process, or a slit coating process using an organic material, but is not limited thereto and can be formed using an ink-jet coating process.

The display device according to an embodiment of the present disclosure can further include a dam structure, a first conductive line TL1, a second conductive line TL2, a first link line LL1, a second link line LL2, a first test pad TPAD1, and a second test pad TPAD2.

The dam structure includes an outer dam DMO that is disposed outside the display area AA and an inner dam DMI that is disposed inside the display area AA. The outer dam DMO is disposed in the non-display area IA of the substrate SUB such that the organic film PCL can be prevented from flowing out of the display area AA. The inner dam DMI is disposed in the display area AA to surround the through-hole TH and prevents the organic film PCL from flowing out from the display area AA to the through-hole TH. The outer dam DMO is illustrated in only FIG. 6 and the inner dam DMI is illustrated in only FIGS. 3 to 5.

The outer dam DMO is disposed outside the display area AA. The outer dam DMO is provided on the interlayer insulating film ILD. The outer dam DMO is disposed in the non-display area IA to be separated from the display area AA. Specifically, the outer dam DMO is provided to surround the outer edge of the display area AA and blocks a flow of the organic film PCL of the encapsulation layer 130. The outer dam DMO is disposed between the display area AA and the pad part PP and blocks a flow of the organic film PCL such that the organic film PCL of the encapsulation layer 130 does not flow into the pad part PP. Accordingly, the outer dam DMO can prevent the organic film PCL from being exposed from the display device or flowing into the pad part PP.

The outer dam DMO includes a lower layer DMOa, an intermediate layer DMOb, and an upper layer DMOc. The lower layer DMOa is provided on the interlayer insulating film ILD, the intermediate layer DMOb is provided on the lower layer DMOa, and the upper layer DMOc is provided on the intermediate layer DMOb.

The lower layer DMOa, the intermediate layer DMOb, and the upper layer DMOc of the outer dam DMO can be formed at the same time as forming the planarization layer PLN, the bank BN, and the spacer SP and can be formed of the same material as the planarization layer PLN, the bank BN, and the spacer SP. For example, the lower layer DMOa of the outer dam DMO can be formed of the same material as the planarization layer PLN at the same time. The intermediate layer DMOb of the outer dam DMO can be formed of the same material as the bank BN at the same time. The upper layer DMOc of the outer dam DMO can be formed of the same material as the spacer SP at the same time.

In FIG. 6, the outer dam DMO includes the lower layer DMOa, the intermediate layer DMOb, and the upper layer DMOc, but the present disclosure is not limited thereto. For example, the outer dam DMO can be formed in a single-layer structure including the lower layer DMOa. For example, the outer dam DMO can be formed in a two-layered structure including the lower layer DMOa and the upper layer DMOc.

The outer dam DMO is covered by the first inorganic film PAS1 and/or the second inorganic film PAS2. The outer dam DMO serves to block a flow of the organic film PCL and is not covered with the organic film PCL. The organic film PCL can be in contact with a part of an inner wall of the outer dam DMO.

The inner dam DMI is disposed between the through-hole TH and the neighboring pixels V surrounding the through-hole TH inside the display area AA. The inner dam DMI is formed on the interlayer insulating film ILD. The inner dam DMI is formed to surround the through-hole TH and blocks a flow of the organic film PCL of the encapsulation layer 130. Accordingly, the inner dam DMI can prevent the organic film PCL from being exposed from the through-hole TH.

The inner dam DMI includes a lower layer DMIa and an upper layer DMIb. The lower layer DMIa is provided on the interlayer insulating film ILD and the upper layer DMIb is provided on the lower layer DMIa.

The lower layer DMIa and the upper layer DMIb of the inner dam DMI can be formed at the same time as forming at least one of the planarization layer PLN, the bank BN, and the spacer SP and can be formed of the same material as at least one of the planarization layer PLN, the bank BN, and the spacer SP. For example, the lower layer DMIa of the inner dam DMI can be formed of the same material as the planarization layer PLN at the same time. The upper layer DMIb of the inner dam DMI can be formed of the same material as the bank BN at the same time.

In FIGS. 3 to 5, the inner dam DMI includes the lower layer DMIa and the upper layer DMIb, but the present disclosure is not limited thereto. For example, the inner dam DMI can be formed in a single-layer structure including the lower layer DMIa. For example, the inner dam DMI can be formed in a three-layered structure including the lower layer DMIa, an intermediate layer, and the upper layer DMIb.

On the other hand, unlike the outer dam DMO, some elements of the light emitting element ED can be stacked on the inner dam DMI. For example, the light emitting layer EL and the second electrode CE can be stacked on the inner dam DMI.

Side surfaces of the light emitting layer EL and the second electrode CE can be exposed from the through-hole TH, and moisture and oxygen may permeate into the exposed side surfaces. In this case, moisture and oxygen permeating into the side surfaces may diffuse into the neighboring pixels P' which are disposed around the through-hole TH and can deteriorate the light emitting element EL.

In order to prevent/address this problem, in an embodiment of the present disclosure, a groove H is formed in the inner dam DMI such that the light emitting layer EL and the second electrode CE which are stacked on the inner dam DMI can be cut off. The groove H penetrates the inner dam DMI and exposes the interlayer insulating film ILD, but the present disclosure is not limited thereto. The groove H can be formed in a recessed shape in the inner dam DMI.

The light emitting layer EL can be cut off by the groove H which is formed in the inner dam DMI. Specifically, a light emitting layer EL1 which is provided between the neighboring pixels V and the inner dam DMI and a light emitting layer EL2 which is provided between the inner dam DMI and the through-hole TH are cut off from each other due to a stepped part provided by the groove H.

The second electrode CE can be cut off by the groove H which is formed in the inner dam DMI. Specifically, a second electrode CE1 which is provided between the neighboring pixels V and the inner dam DMI and a second electrode CE2 which is provided between the inner dam DMI and the through-hole TH are cut off from each other due to a stepped part provided by the groove H.

Accordingly, with the display device according to an embodiment of the present disclosure, it is possible to prevent moisture that might have permeated into the side surfaces of the light emitting layer EL2 and the second electrode CE2 exposed from the through-hole TH, from diffusing into the neighboring pixels V disposed around the through-hole TH.

On the other hand, the inner dam DMI has a closed curve shape corresponding to the shape of the through-hole TH.

For example, when the through-hole TH has a circular shape, the inner dam DMI also has a circular shape. Alternatively, regardless of the shape of the through-hole TH, the inner dam DMI can have an elliptical shape surrounding the through-hole TH. For example, when the through-hole TH has a polygonal shape such as a quadrangular shape, a hexagonal shape, or an octagonal shape, the inner dam DMI can have one of a polygonal shape, a circular shape, and an elliptical shape surrounding the through-hole TH. In the following description, for the purpose of convenience, it is assumed that the inner dam DMI has a circular shape which is concentric with the through-hole TH and surrounds the through-hole TH.

The first conductive line TL1 is provided on the interlayer insulating film ILD. The first conductive line TL1 is provided along the inner dam DMI between the neighboring pixels P' and the inner dam DMI. The first conductive line TL1 is disposed in contact with a first side of the inner dam DMI. In this case, the first conductive line TL1 has a closed curve shape corresponding to the shape of the inner dam DMI. For example, when the inner dam DMI has a circular shape, the first conductive line TL1 also has a circular shape, for example, a ring shape.

The first conductive line TL1 is formed in the same layer as one of the active layer A, the gate electrode G, the source electrode S, and the drain electrode D of the transistor T. The first conductive line TL1 is formed of the same material as one of the active layer A, the gate electrode G, the source electrode S, and the drain electrode D of the transistor T. In FIGS. 3 to 5, the first conductive line TL1 is formed of the same material as the source electrode S and the drain electrode D of the transistor T in the same layer, but the present disclosure is not limited thereto. On the other hand, the first conductive line TL1 can be formed of the same material as the first electrode AE in the same layer.

The light emitting layer EL, the second electrode CE, the first inorganic film PAS1, the organic film PCL, and the second inorganic film PAS2 are sequentially stacked on the first conductive line TL1. The first conductive line TL1 is connected to the first link line LL1 via a first contact hole CH1 penetrating the interlayer insulating film ILD.

The second conductive line TL2 is provided on the interlayer insulating film ILD. The second conductive line TL2 is provided along the inner dam DMI between the inner dam DMI and the through-hole TH. The second conductive line TL2 is disposed in contact with a second side of the inner dam DMI. Here, the second side is opposite to the first side on which the first conductive line TL1 is disposed. In this case, the second conductive line TL2 has a closed curve shape corresponding to the shape of the inner dam DMI. For example, when the inner dam DMI has a circular shape, the second conductive line TL2 also has a circular shape, e.g., a ring shape.

The second conductive line TL2 is formed in the same layer as one of the active layer A, the gate electrode G, the source electrode S, and the drain electrode D of the transistor T. The second conductive line TL2 is formed of the same material as one of the active layer A, the gate electrode G, the source electrode S, and the drain electrode D of the transistor T. In FIGS. 3 to 5, the second conductive line TL2 is formed of the same material as the source electrode S and the drain electrode D of the transistor T in the same layer, but the present disclosure is not limited thereto. On the other hand, the second conductive line TL2 can be formed of the same material as the first electrode AE in the same layer.

The light emitting layer EL, the second electrode CE, the first inorganic film PAS1, the organic film PCL, and the second inorganic film PAS2 are sequentially stacked on the second conductive line TL2. The second conductive line TL2 is connected to the second link line LL2 via a second contact hole CH2 penetrating the interlayer insulating film ILD.

Since the inner dam DMI is provided between the first conductive line TL1 and the second conductive line TL2, the first conductive line TL1 and the second conductive line TL2 are not electrically connected to each other. For example, the first conductive line TL1 and the second conductive line TL2 are electrically insulated from each other.

The first test pad TPAD1 is provided between the inner dam DMI and the through-hole TH. The first test pad TPAD1 is provided on the gate insulating film GI. At this time, the first test pad TPAD1 can be exposed without other layers formed thereon as illustrated in FIGS. 3 and 4.

The first test pad TPAD1 is formed in a layer different from that of the first conductive line TL1. Specifically, the first test pad TPAD1 is formed in one of layers which are provided between the first conductive line TL1 and the substrate SUB. At this time, the first test pad TPAD1 can be formed in the same layer as the active layer A or the gate electrode G of the transistor T. The first test pad TPAD1 can be formed of the same material as the active layer A or the gate electrode G of the transistor T.

One first test pad TPAD1 is formed as illustrated in FIGS. 3 and 4, but the present disclosure is not limited thereto. For example, two or more first test pads TPAD1 can be formed.

The second test pad TPAD2 is provided between the inner dam DMI and the through-hole TH. The second test pad TPAD2 is formed on the gate insulating film GI. At this time, the second test pad TPAD2 can be exposed without other layers formed thereon as illustrated in FIGS. 3 and 4.

The second test pad TPAD2 is formed in a layer different from that of the second conductive line TL2. Specifically, the second test pad TPAD2 is formed in one of layers which are provided between the second conductive line TL2 and the substrate SUB. At this time, the second test pad TPAD2 can be formed in the same layer as the active layer A or the gate electrode G of the transistor T. The second test pad TPAD2 can be formed of the same material as the active layer A or the gate electrode G of the transistor T.

Alternatively, the second test pad TPAD2 can be formed of the same material as the second conductive line TL2 as illustrated in FIG. 4. The second test pad TPAD2 can be formed integrally with the second conductive line TL2 and the second link line LL2. For example, the second test pad TPAD2 can be a part of a line extending from the second conductive line TL2 to the through-hole TH.

One second test pad TPAD2 is formed as illustrated in FIGS. 3 and 4, but the present disclosure is not limited thereto. For example, two or more second test pads TPAD2 can be formed.

The first link line LL1 electrically connects the first conductive line TL1 to the first test pad TPAD1. Specifically, one end of the first link line LL1 is connected to the first conductive line TL1 and the other end thereof is connected to the first test pad TPAD1. The first conductive line TL1 is connected to the first link line LL1 via a first contact hole CH1 penetrating the interlayer insulating film ILD. The first test pad TPAD1 can be formed integrally with the first link line LL1. For example, one end of the first test pad TPAD1 can be connected to the first link line LL1.

Accordingly, the first test pad TPAD1 can be electrically connected to the first conductive line TL1 via the first link line LL1.

The second link line LL2 electrically connects the second conductive line TL2 to the second test pad TPAD2. Specifically, one end of the second link line LL2 is connected to the second conductive line TL2 and the other end thereof is connected to the second test pad TPAD2. The second conductive line TL2 is connected to the second link line LL2 via a second contact hole CH2 penetrating the interlayer insulating film ILD. The second test pad TPAD2 can be formed integrally with the second link line LL2. For example, one end of the second test pad TPAD2 can be connected to the second link line LL2.

Accordingly, the second test pad TPAD2 can be electrically connected to the second conductive line TL2 via the second link line LL2.

According to the embodiment of the present disclosure, it is possible to ascertain whether the light emitting layer EL and the second electrode CE have been cut off in the inner dam DMI using the first conductive line TL1 and the second conductive line TL2.

The light emitting layer EL and the second electrode CE are stacked on the first conductive line TL1. The light emitting layer EL and the second electrode CE are also stacked on the second conductive line TL2. At this time, the light emitting layer EL and the second electrode CE can be cut off in the inner dam DMI provided between the first conductive line TL1 and the second conductive line TL2. Specifically, the light emitting layer EL and the second electrode CE can be cut off by the groove H which is formed in the inner dam DMI.

When the light emitting layer EL and the second electrode CE are cut off, the first conductive line TL1 and the second conductive line TL2 are not electrically connected to each other. This is because the light emitting layer EL1 formed on the first conductive line TL1 and the light emitting layer EL2 formed on the second conductive line TL2 are separated and are not electrically connected to each other. This is also because the second electrode CE1 formed on the first conductive line TL1 and the second electrode CE2 formed on the second conductive line TL2 are separated and are not electrically connected to each other.

Since the inner dam DMI formed of an insulating material is formed between the first conductive line TL1 and the second conductive line TL2, the first conductive line TL1 and the second conductive line TL2 are not electrically connected but are insulated from each other.

According to the embodiment of the present disclosure, it is possible to ascertain whether the light emitting layer EL and the second electrode CE have been cut off in the inner dam DMI by measuring a current or resistance between the first test pad TPAD1 and the second test pad TPAD2.

Specifically, when the current between the first test pad TPAD1 and the second test pad TPAD2 is greater than a first threshold value or the resistance therebetween is equal to or less than a second threshold value, it can be determined that the light emitting layer EL and the second electrode CE are not cut off in the inner dam DMI.

The first test pad TPAD1 is electrically connected to the first conductive line TL1. The second test pad TPAD2 is electrically connected to the second conductive line TL2. When the current between the first test pad TPAD1 and the second test pad TPAD2 is greater than the first threshold value or the resistance therebetween is equal to or less than the second threshold value, it means that the first conductive line TL1 and the second conductive line TL2 are electrically connected to each other.

This means that the light emitting layer EL1 formed on the first side of the inner dam DMI and the light emitting layer EL2 formed on the second side of the inner dam DMI are not cut off and are electrically connected to each other. Alternatively, it means that the second electrode CE1 formed on the first side of the inner dam DMI and the second electrode CE2 formed on the second side of the inner dam DMI are not cut off and are electrically connected to each other.

On the other hand, when the current between the first test pad TPAD1 and the second test pad TPAD2 is equal to or less than the first threshold value or the resistance therebetween is greater than the second threshold value, it can be determined that the light emitting layer EL and the second electrode CE are cut off in the inner dam DMI.

When the current between the first test pad TPAD1 and the second test pad TPAD2 is equal to or less than the first threshold value or the resistance therebetween is greater than the second threshold value, it means that the first conductive line TL1 and the second conductive line TL2 are not electrically connected but are insulated from each other.

This means that the light emitting layer EL1 formed on the first side of the inner dam DMI and the light emitting layer EL2 formed on the second side of the inner dam DMI are cut off and are electrically insulated from each other. Alternatively, it means that the second electrode CE1 formed on the first side of the inner dam DMI and the second electrode CE2 formed on the second side of the inner dam DMI are cut off and are electrically insulated from each other.

In the display device according to the embodiment of the present disclosure, the light emitting layer EL and the second electrode CE are cut off by forming the groove H in the inner dam DMI. Accordingly, with the display device according to the embodiment of the present disclosure, it is possible to prevent moisture that may have permeated into the side surfaces of the light emitting layer EL and the second electrode EC, which are exposed from the through-hole TH, from diffusing into the neighboring pixels V disposed around the through-hole TH.

In the display device according to the embodiment of the present disclosure, since the first conductive line TL1 and the second conductive line TL2 are formed on the first side and the second side of the inner dam DMI, respectively, it is possible to easily ascertain whether the light emitting layer EL and the second electrode CE have been cut off in the inner dam DMI using the conductive lines. Accordingly, with the display device according to the embodiment of the present disclosure, it is possible to improve reliability of products.

Figure 7:
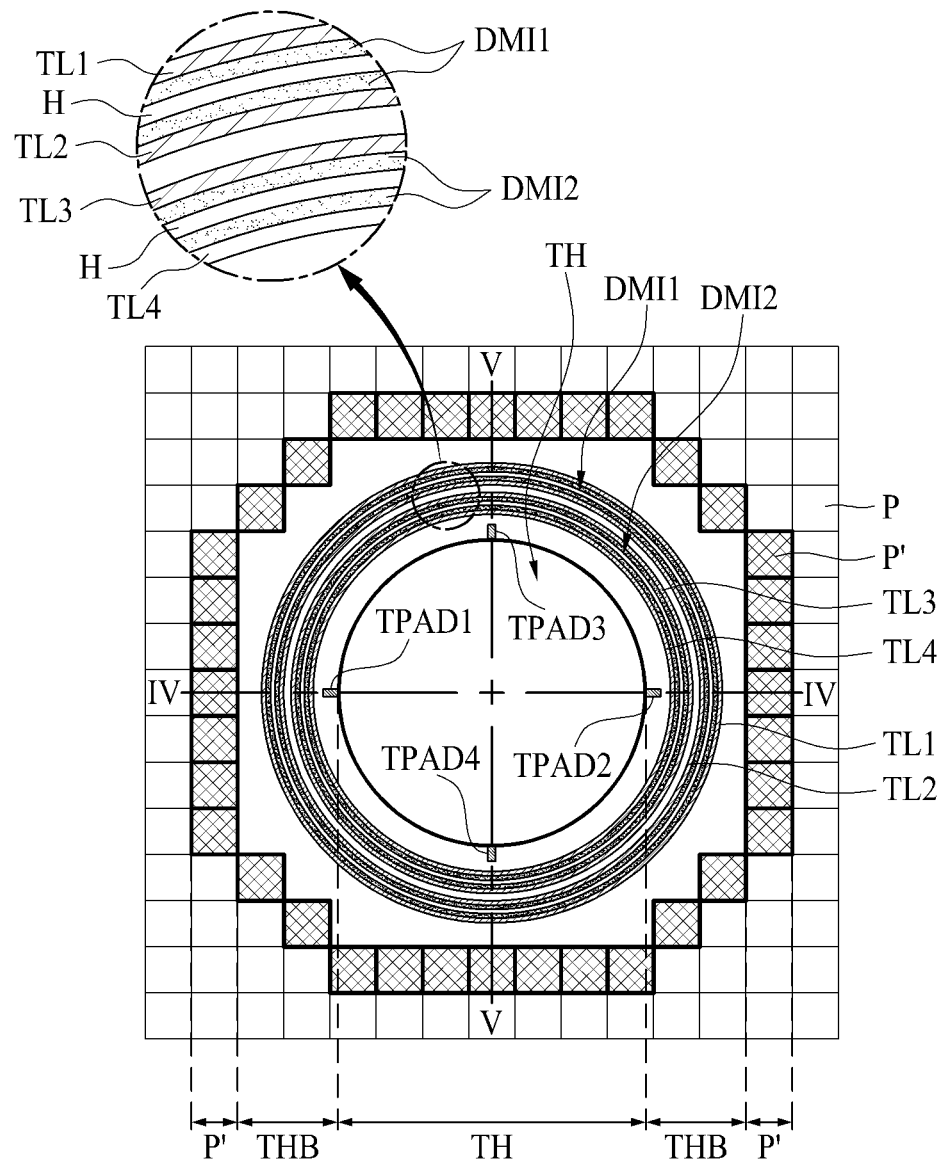
FIG. 7 is an enlarged plan view illustrating a structure of a through-hole which is disposed in a display area of a display device according to another embodiment of the present disclosure.

FIG. 7 is an enlarged plan view illustrating a structure of a through-hole which is disposed in a display area of a display device according to another embodiment of the present disclosure.

Referring to FIG. 7, a through-hole TH is disposed in the display area AA. Pixels P are disposed around the through-hole TH. Pixels P which are disposed to be closest to the through-hole TH out of the pixels P can be defined as neighboring pixels P'. A part between the neighboring pixels P' and the through-hole TH is defined as a hole boundary part THB.

A first inner dam DMI1 and a second inner dam DMI2 are disposed in the hole boundary part THB. The first inner dam DMI1 is disposed between the through-hole TH and the neighboring pixels P'. The second inner dam DMI2 is disposed between the through-hole TH and the first inner dam DMI1. The first inner dam DMI1 and the second inner dam DMI2 have a closed curve shape surrounding the through-hole TH to correspond to the shape of the through-hole TH. The first inner dam DMI1 and the second inner dam DMI2 can have a closed curve shape different from that of the through-hole TH or can have a closed curve shape with the same shape but a different size. For example, the first and second inner dams DMI1 and DMI2 and the through-hole TH can be concentrically separated from each other with a constant gap therebetween.

Hereinafter, a sectional structure of the display device according to an embodiment of the present disclosure will be described with reference to FIGS. 8 and 9.

Figure 8:
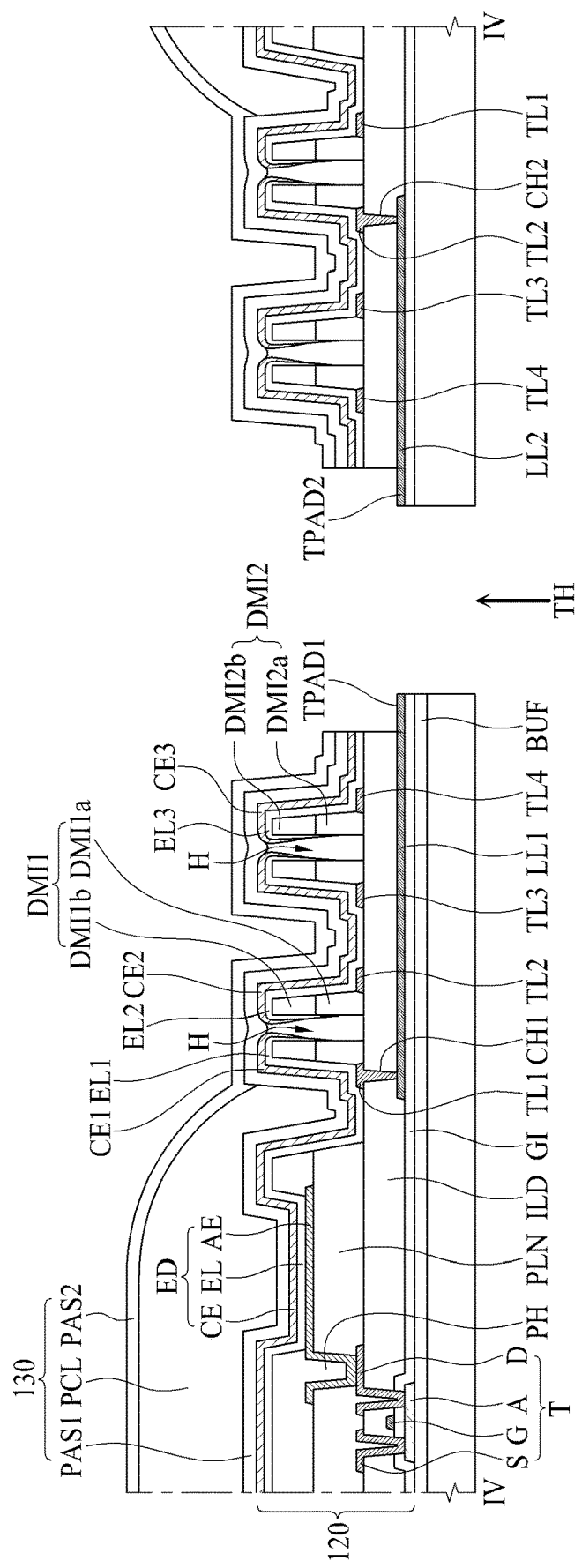
FIG. 8 is a sectional view illustrating an exemplary sectional structure taken along line IV-IV in FIG. 7.

FIG. 8 is a sectional view illustrating an exemplary sectional structure taken along line IV-IV in FIG. 7. FIG. 9 is a sectional view illustrating another exemplary sectional structure taken along line V-V in FIG. 7.

Figure 9:
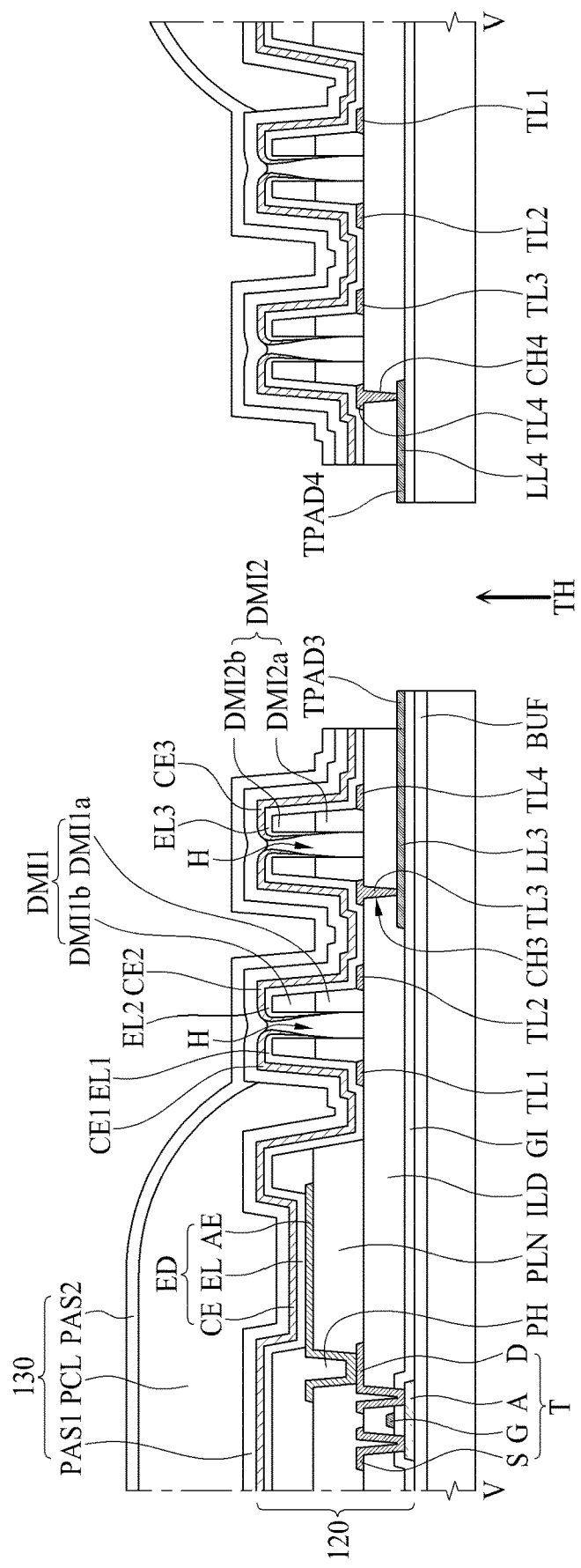
FIG. 9 is a sectional view illustrating an exemplary sectional structure taken along line V-V in FIG. 7.

Referring to FIGS. 8 and 9, a display device according to another embodiment of the present disclosure includes a substrate SUB, a buffer film BUF, a pixel array layer 120, an encapsulation layer 130, a first inner dam DMI1, a second inner dam DMI2, a first conductive line TL1, a second conductive line TL2, a third conductive line TL3, a fourth conductive line TL4, a first link line LL1, a second link line LL2, a third link line LL3, a fourth link line LL4, a first test pad TPAD1, a second test pad TPAD2, a third test pad TPAD3, a fourth test pad TPAD4, and a through-hole TH.

The substrate SUB, the buffer film BUF, the pixel array layer 120, and the encapsulation layer 130 which are illustrated in FIGS. 8 and 9 are substantially the same as the substrate SUB, the buffer film BUF, the pixel array layer 120, and the encapsulation layer 130 which are illustrated in FIGS. 3 to 6 and thus detailed description thereof will not be repeated.

Configurations different from those of the display device according to the embodiment of the present disclosure illustrated in FIGS. 3 to 6 will be mainly described below.

The first inner dam DMI1 is disposed between the through-hole TH and the neighboring pixels P' surrounding the through-hole TH inside the display area AA. The first inner dam DMI1 is formed on the interlayer insulating film ILD. The first inner dam DMI1 is formed to surround the through-hole TH and blocks a flow of the organic film PCL of the encapsulation layer 130. Accordingly, the first inner dam DMI1 can prevent the organic film PCL from being exposed from the through-hole TH.

The first inner dam DMI1 includes a lower layer DMI1a and an upper layer DMI1b. The lower layer DMI1a is formed on the interlayer insulating film ILD and the upper layer DMI1b is formed on the lower layer DMI1a.

The lower layer DMI1a and the upper layer DMI1b of the first inner dam DMI1 can be formed at the same time as forming at least one of the planarization layer PLN, the bank BN, and the spacer SP and can be formed of the same material as at least one of the planarization layer PLN, the bank BN, and the spacer SP. For example, the lower layer DMI1a of the first inner dam DMI1 can be formed of the same material as the planarization layer PLN at the same time. The upper layer DMI1b of the first inner dam DMI1 can be formed of the same material as the bank BN at the same time.

In FIGS. 8 and 9, the first inner dam DMI1 includes the lower layer DMI1a and the upper layer DMI1b, but the present disclosure is not limited thereto. For example, the first inner dam DMI1 can be formed in a single-layer structure including the lower layer DMI1a. For example, the first inner dam DMI1 can be formed in a three-layered structure including the lower layer DMI1a, an intermediate layer, and the upper layer DMI1b.

The second inner dam DMI2 is disposed between the through-hole TH and the first inner dam DMI1 inside the display area AA. The second inner dam DMI2 is formed on the interlayer insulating film ILD. The second inner dam DMI2 is formed to surround the through-hole TH and blocks a flow of the organic film PCL of the encapsulation layer 130. Particularly, the second inner dam DMI2 secondarily blocks a flow of the organic film PCL of the encapsulation layer 130 when the organic film PCL of the encapsulation layer 130 flows over the first inner dam DMI1. Accordingly, the second inner dam DMI2 can more effectively prevent the organic film PCL from being exposed from the through-hole TH.

The second inner dam DMI2 includes a lower layer DMI2a and an upper layer DMI2b. The lower layer DMI2a is formed on the interlayer insulating film ILD and the upper layer DMI2b is formed on the lower layer DMI2a.

The lower layer DMI2a and the upper layer DMI2b of the second inner dam DMI2 can be formed at the same time as forming at least one of the planarization layer PLN, the bank BN, and the spacer SP and can be formed of the same material as at least one of the planarization layer PLN, the bank BN, and the spacer SP. For example, the lower layer DMI2a of the second inner dam DMI2 can be formed of the same material as the planarization layer PLN at the same time. The upper layer DMI2b of the second inner dam DMI2 can be formed of the same material as the bank BN at the same time.

In FIGS. 8 and 9, the second inner dam DMI2 includes the lower layer DMI2a and the upper layer DMI2b, but the present disclosure is not limited thereto. For example, the second inner dam DMI2 can be formed in a single-layer structure including the lower layer DMI2a. For example, the second inner dam DMI2 can be formed in a three-layered structure including the lower layer DMI2a, an intermediate layer, and the upper layer DMI2b.

On the other hand, unlike the outer dam DMO, some elements of the light emitting element ED can be stacked on the first inner dam DMI1 and the second inner dam DMI2. For example, the light emitting layer EL and the second electrode CE can be stacked on the first inner dam DMI1 and the second inner dam DMI2.

Side surfaces of the light emitting layer EL and the second electrode CE can be exposed from the through-hole TH, and moisture and oxygen can permeate the exposed side surfaces. In this case, moisture and oxygen permeating the side surfaces can diffuse into the neighboring pixels P' which are disposed around the through-hole TH and deteriorate the light emitting element EL.

In order to prevent this problem, in the embodiment of the present disclosure, a groove H is formed in each of the first inner dam DMI1 and the second inner dam DMI2 such that the light emitting layer EL and the second electrode CE which are stacked on the first inner dam DMI1 and the second inner dam DMI2 can be cut off. The grooves H penetrate the first inner dam DMI1 and the second inner dam DMI2 and expose the interlayer insulating film ILD, but the present disclosure is not limited thereto. The groove H can be formed in a recessed shape in each of the first inner dam DMI1 and the second inner dam DMI2.

The light emitting layer EL can be cut off by the grooves H which are formed in the first inner dam DMI1 and the second inner dam DMI2. Specifically, a light emitting layer EL1 which is formed between the neighboring pixels P' and the first inner dam DMI1, a light emitting layer EL2 which is formed between the first inner dam DMI1 and the second inner dam DMI2, and a light emitting layer EL3 which is formed between the second inner dam DMI2 and the through-hole TH are cut off from each other due to stepped parts formed by the grooves H.

The second electrode CE can be cut off by the groove H which is formed in the first inner dam DMI1. Specifically, a second electrode CE1 which is formed between the neighboring pixels V and the first inner dam DMI1, a second electrode CE2 which is formed between the first inner dam DMI1 and the second inner dam DMI2, and a second electrode CE3 which is formed between the second inner dam DMI2 and the through-hole TH are cut off from each other due to stepped parts formed by the grooves H.

Accordingly, with the display device according to an embodiment of the present disclosure, it is possible to prevent moisture having permeating the side surfaces of the light emitting layer EL3 and the second electrode CE3 exposed from the through-hole TH from diffusing into the neighboring pixels P' disposed around the through-hole TH.

On the other hand, each of the first inner dam DMI1 and the second inner dam DMI2 has a closed curve shape corresponding to the shape of the through-hole TH. For example, when the through-hole TH has a circular shape, the first inner dam DMI1 and the second inner dam DMI2 also have a circular shape. Alternatively, regardless of the shape of the through-hole TH, the first inner dam DMI1 and the second inner dam DMI2 can have an elliptical shape surrounding the through-hole TH. For example, when the through-hole TH has a polygonal shape such as a quadrangular shape, a hexagonal shape, or an octagonal shape, the first inner dam DMI1 and the second inner dam DMI2 can have one of a polygonal shape, a circular shape, and an elliptical shape surrounding the through-hole TH. In the following description, for the purpose of convenience, it is assumed that the first inner dam DMI1 and the second inner dam DMI2 have a circular shape which is concentric with the through-hole TH and surrounds the through-hole TH.

The first conductive line TL1 is provided on the interlayer insulating film ILD. The first conductive line TL1 is provided along the inner dam DMI between the neighboring pixels P' and the first inner dam DMI1. The first conductive line TL1 is disposed in contact with a first side of the first inner dam DMI1. In this case, the first conductive line TL1 has a closed curve shape corresponding to the shape of the first inner dam DMI1. For example, when the first inner dam DMI1 has a circular shape, the first conductive line TL1 also has a circular shape, for example, a ring shape.

The first conductive line TL1 is formed in the same layer as one of the active layer A, the gate electrode G, the source electrode S, and the drain electrode D of the transistor T. The first conductive line TL1 is formed of the same material as one of the active layer A, the gate electrode G, the source electrode S, and the drain electrode D of the transistor T. In FIGS. 8 and 9, the first conductive line TL1 is formed of the same material as the source electrode S and the drain electrode D of the transistor T in the same layer, but the present disclosure is not limited thereto. On the other hand, the first conductive line TL1 can be formed of the same material as the first electrode AE in the same layer.

The light emitting layer EL, the second electrode CE, the first inorganic film PAS1, the organic film PCL, and the second inorganic film PAS2 are sequentially stacked on the first conductive line TL1. The first conductive line TL1 is connected to the first link line LL1 via a first contact hole CH1 penetrating the interlayer insulating film ILD.

The second conductive line TL2 is provided on the interlayer insulating film ILD. The second conductive line TL2 is provided along the first inner dam DMI1 between the first inner dam DMI1 and the through-hole TH. The second conductive line TL2 is disposed in contact with a second side of the first inner dam DMI1. Here, the second side is opposite to the first side on which the first conductive line TL1 is disposed. In this case, the second conductive line TL2 has a closed curve shape corresponding to the shape of the first inner dam DMI1. For example, when the first inner dam DMI1 has a circular shape, the second conductive line TL2 also has a circular shape, for example, a ring shape.

The second conductive line TL2 is formed in the same layer as one of the active layer A, the gate electrode G, the source electrode S, and the drain electrode D of the transistor T. The second conductive line TL2 is formed of the same material as one of the active layer A, the gate electrode G, the source electrode S, and the drain electrode D of the transistor T. In FIGS. 8 and 9, the second conductive line TL2 is formed of the same material as the source electrode S and the drain electrode D of the transistor T in the same layer, but the present disclosure is not limited thereto. On the other hand, the second conductive line TL2 can be formed of the same material as the first electrode AE in the same layer.

The light emitting layer EL, the second electrode CE, the first inorganic film PAS1, the organic film PCL, and the second inorganic film PAS2 are sequentially stacked on the second conductive line TL2. The second conductive line TL2 is connected to the second link line LL2 via a second contact hole CH2 penetrating the interlayer insulating film ILD.

Since the first inner dam DMI1 is provided between the first conductive line TL1 and the second conductive line TL2, the first conductive line TL1 and the second conductive line TL2 are not electrically connected to each other. For example, the first conductive line TL1 and the second conductive line TL2 are electrically insulated from each other.

The first test pad TPAD1 is provided between the second inner dam DMI2 and the through-hole TH. The first test pad TPAD1 is formed on the gate insulating film GI. At this time, the first test pad TPAD1 can be exposed without other layers formed thereon as illustrated in FIG. 8.

The first test pad TPAD1 is formed in a layer different from that of the first conductive line TL1. Specifically, the first test pad TPAD1 is formed in one of layers which are provided between the first conductive line TL1 and the substrate SUB. At this time, the first test pad TPAD1 can be formed in the same layer as the active layer A or the gate electrode G of the transistor T. The first test pad TPAD1 can be formed of the same material as the active layer A or the gate electrode G of the transistor T.

One first test pad TPAD1 is formed as illustrated in FIG. 7, but the present disclosure is not limited thereto. For example, two or more first test pads TPAD1 can be formed.

The second test pad TPAD2 is provided between the second inner dam DMI2 and the through-hole TH. The second test pad TPAD2 is formed on the gate insulating film GI. At this time, the second test pad TPAD2 can be exposed without other layers formed thereon as illustrated in FIG. 8.

The second test pad TPAD2 is formed in a layer different from that of the second conductive line TL2. Specifically, the second test pad TPAD2 is formed in one of layers which are provided between the second conductive line TL2 and the substrate SUB. At this time, the second test pad TPAD2 can be formed in the same layer as the active layer A or the gate electrode G of the transistor T. The second test pad TPAD2 can be formed of the same material as the active layer A or the gate electrode G of the transistor T.

One second test pad TPAD2 is formed as illustrated in FIG. 7, but the present disclosure is not limited thereto. For example, two or more second test pads TPAD2 can be formed.

The first link line LL1 electrically connects the first conductive line TL1 to the first test pad TPAD1. Specifically, one end of the first link line LL1 is connected to the first conductive line TL1 and the other end thereof is connected to the first test pad TPAD1. The first conductive line TL1 is connected to the first link line LL1 via a first contact hole CH1 penetrating the interlayer insulating film ILD. The first test pad TPAD1 can be formed integrally with the first link line LL1. For example, one end of the first test pad TPAD1 can be connected to the first link line LL1.

Accordingly, the first test pad TPAD1 can be electrically connected to the first conductive line TL1 via the first link line LL1.

The second link line LL2 electrically connects the second conductive line TL2 to the second test pad TPAD2. Specifically, one end of the second link line LL2 is connected to the second conductive line TL2 and the other end thereof is connected to the second test pad TPAD2. The second conductive line TL2 is connected to the second link line LL2 via a second contact hole CH2 penetrating the interlayer insulating film ILD. The second test pad TPAD2 can be formed integrally with the second link line LL2. For example, one end of the second test pad TPAD2 can be connected to the second link line LL2.

Accordingly, the second test pad TPAD2 can be electrically connected to the second conductive line TL2 via the second link line LL2.

According to the embodiment of the present disclosure, it is possible to ascertain whether the light emitting layer EL and the second electrode CE have been cut off in the first inner dam DMI1 using the first conductive line TL1 and the second conductive line TL2.

The light emitting layer EL and the second electrode CE are stacked on the first conductive line TL1. The light emitting layer EL and the second electrode CE are also stacked on the second conductive line TL2. At this time, the light emitting layer EL and the second electrode CE can be cut off in the first inner dam DMI1 provided between the first conductive line TL1 and the second conductive line TL2. Specifically, the light emitting layer EL and the second electrode CE can be cut off by the groove H which is formed in the first inner dam DMI1.

When the light emitting layer EL and the second electrode CE are cut off, the first conductive line TL1 and the second conductive line TL2 are not electrically connected to each other. This is because the light emitting layer EL1 formed on the first conductive line TL1 and the light emitting layer EL2 formed on the second conductive line TL2 are separated and are not electrically connected to each other. This is also because the second electrode CE1 formed on the first conductive line TL1 and the second electrode CE2 formed on the second conductive line TL2 are separated and are not electrically connected to each other.

Since the first inner dam DMI1 formed of an insulating material is formed between the first conductive line TL1 and the second conductive line TL2, the first conductive line TL1 and the second conductive line TL2 are not electrically connected but are insulated from each other.

According to the embodiment of the present disclosure, it is possible to ascertain whether the light emitting layer EL and the second electrode CE have been cut off in the first inner dam DMI1 by measuring a current or resistance between the first test pad TPAD1 and the second test pad TPAD2.

Specifically, when the current between the first test pad TPAD1 and the second test pad TPAD2 is greater than a first threshold value or the resistance therebetween is equal to or less than a second threshold value, it can be determined that the light emitting layer EL and the second electrode CE are not cut off in the first inner dam DMI1.

The first test pad TPAD1 is electrically connected to the first conductive line TL1. The second test pad TPAD2 is electrically connected to the second conductive line TL2. When the current between the first test pad TPAD1 and the second test pad TPAD2 is greater than the first threshold value or the resistance therebetween is equal to or less than the second threshold value, it means that the first conductive line TL1 and the second conductive line TL2 are electrically connected to each other.

This means that the light emitting layer EL1 formed on the first side of the first inner dam DMI1 and the light emitting layer EL2 formed on the second side of the first inner dam DMI1 are not cut off and are electrically connected to each other. Alternatively, it means that the second electrode CE1 formed on the first side of the first inner dam DMI1 and the second electrode CE2 formed on the second side of the first inner dam DMI1 are not cut off and are electrically connected to each other.

On the other hand, when the current between the first test pad TPAD1 and the second test pad TPAD2 is equal to or less than the first threshold value or the resistance therebetween is greater than the second threshold value, it can be determined that the light emitting layer EL and the second electrode CE are cut off in the first inner dam DMI1.

When the current between the first test pad TPAD1 and the second test pad TPAD2 is equal to or less than the first threshold value or the resistance therebetween is greater than the second threshold value, it means that the first conductive line TL1 and the second conductive line TL2 are not electrically connected but are insulated from each other.

This means that the light emitting layer EL1 formed on the first side of the first inner dam DMI1 and the light emitting layer EL2 formed on the second side of the first inner dam DMI1 are cut off and are electrically insulated from each other. Alternatively, it means that the second electrode CE1 formed on the first side of the first inner dam DMI1 and the second electrode CE2 formed on the second side of the first inner dam DMI1 are cut off and are electrically insulated from each other.

The third conductive line TL3 is provided on the interlayer insulating film ILD. The third conductive line TL3 is provided along the second inner dam DMI2 between the first inner dam DMI1 and the second inner dam DMI2. The third conductive line TL3 is disposed in contact with a first side of the second inner dam DMI2. In this case, the third conductive line TL3 has a closed curve shape corresponding to the shape of the second inner dam DMI2. For example, when the second inner dam DMI2 has a circular shape, the third conductive line TL3 also has a circular shape, for example, a ring shape.

The third conductive line TL3 is formed in the same layer as one of the active layer A, the gate electrode G, the source electrode S, and the drain electrode D of the transistor T. The third conductive line TL3 is formed of the same material as one of the active layer A, the gate electrode G, the source electrode S, and the drain electrode D of the transistor T. In FIGS. 8 and 9, the third conductive line TL3 is formed of the same material as the source electrode S and the drain electrode D of the transistor T in the same layer, but the present disclosure is not limited thereto. On the other hand, the third conductive line TL3 can be formed of the same material as the first electrode AE in the same layer.

The light emitting layer EL, the second electrode CE, the first inorganic film PAS1, the organic film PCL, and the second inorganic film PAS2 are sequentially stacked on the third conductive line TL3. The third conductive line TL3 is connected to the third link line LL3 via a third contact hole CH3 penetrating the interlayer insulating film ILD.

The fourth conductive line TL4 is provided on the interlayer insulating film ILD. The fourth conductive line TL4 is provided along the second inner dam DMI2 between the second inner dam DMI2 and the through-hole TH. The fourth conductive line TL4 is disposed in contact with a second side of the second inner dam DMI2. Here, the second side is opposite to the first side on which the third conductive line TL3 is disposed. In this case, the fourth conductive line TL4 has a closed curve shape corresponding to the shape of the second inner dam DMI2. For example, when the second inner dam DMI2 has a circular shape, the fourth conductive line TL4 also has a circular shape, for example, a ring shape.

The fourth conductive line TL4 is formed in the same layer as one of the active layer A, the gate electrode G, the source electrode S, and the drain electrode D of the transistor T. The fourth conductive line TL4 is formed of the same material as one of the active layer A, the gate electrode G, the source electrode S, and the drain electrode D of the transistor T. In FIGS. 8 and 9, the fourth conductive line TL4 is formed of the same material as the source electrode S and the drain electrode D of the transistor T in the same layer, but the present disclosure is not limited thereto. On the other hand, the fourth conductive line TL4 can be formed of the same material as the first electrode AE in the same layer.

The light emitting layer EL, the second electrode CE, the first inorganic film PAS1, the organic film PCL, and the second inorganic film PAS2 are sequentially stacked on the fourth conductive line TL4. The fourth conductive line TL4 is connected to the fourth link line LL4 via a fourth contact hole CH4 penetrating the interlayer insulating film ILD.

Since the second inner dam DMI2 is provided between the third conductive line TL3 and the fourth conductive line TL4, the third conductive line TL3 and the fourth conductive line TL4 are not electrically connected to each other. For example, the third conductive line TL3 and the fourth conductive line TL4 are electrically insulated from each other.

The third test pad TPAD3 is provided between the second inner dam DMI2 and the through-hole TH. The third test pad TPAD3 is formed on the gate insulating film GI. At this time, the third test pad TPAD3 can be exposed without other layers formed thereon as illustrated in FIG. 9.

The third test pad TPAD3 is formed in a layer different from that of the third conductive line TL3. Specifically, the third test pad TPAD3 is formed in one of layers which are provided between the third conductive line TL3 and the substrate SUB. At this time, the third test pad TPAD3 can be formed in the same layer as the active layer A or the gate electrode G of the transistor T. The third test pad TPAD3 can be formed of the same material as the active layer A or the gate electrode G of the transistor T.

One third test pad TPAD3 is formed as illustrated in FIG. 7, but the present disclosure is not limited thereto. For example, two or more third test pads TPAD3 can be formed.

The fourth test pad TPAD4 is provided between the second inner dam DMI2 and the through-hole TH. The fourth test pad TPAD4 is formed on the gate insulating film GI. At this time, the fourth test pad TPAD4 can be exposed without other layers formed thereon as illustrated in FIG. 9.

The fourth test pad TPAD4 is formed in a layer different from that of the fourth conductive line TL4. Specifically, the second test pad TPAD2 is formed in one of layers which are provided between the fourth conductive line TL4 and the substrate SUB. At this time, the fourth test pad TPAD4 can be formed in the same layer as the active layer A or the gate electrode G of the transistor T. The fourth test pad TPAD4 can be formed of the same material as the active layer A or the gate electrode G of the transistor T.

One fourth test pad TPAD4 is formed as illustrated in FIG. 7, but the present disclosure is not limited thereto. For example, two or more fourth test pads TPAD4 can be formed.

The third link line LL3 electrically connects the third conductive line TL3 to the third test pad TPAD3. Specifically, one end of the third link line LL3 is connected to the third conductive line TL3 and the other end thereof is connected to the third test pad TPAD3. The third conductive line TL3 is connected to the third link line LL3 via a third contact hole CH3 penetrating the interlayer insulating film ILD. The third test pad TPAD3 can be formed integrally with the third link line LL3. For example, one end of the third test pad TPAD3 can be connected to the third link line LL3.

Accordingly, the third test pad TPAD3 can be electrically connected to the third conductive line TL3 via the third link line LL3.

The fourth link line LL4 electrically connects the fourth conductive line TL4 to the fourth test pad TPAD4. Specifically, one end of the fourth link line LL4 is connected to the fourth conductive line TL4 and the other end thereof is connected to the fourth test pad TPAD4. The fourth conductive line TL4 is connected to the fourth link line LL4 via a fourth contact hole CH4 penetrating the interlayer insulating film ILD. The fourth test pad TPAD4 can be formed integrally with the fourth link line LL4. For example, one end of the fourth test pad TPAD4 can be connected to the fourth link line LL4.

Accordingly, the fourth test pad TPAD4 can be electrically connected to the fourth conductive line TL4 via the fourth link line LL4.

According to the embodiment of the present disclosure, it is possible to ascertain whether the light emitting layer EL and the second electrode CE have been cut off in the second inner dam DMI2 using the third conductive line TL3 and the fourth conductive line TL4.

The light emitting layer EL and the second electrode CE are stacked on the third conductive line TL3. The light emitting layer EL and the second electrode CE are also stacked on the fourth conductive line TL4. At this time, the light emitting layer EL and the second electrode CE can be cut off in the second inner dam DMI2 provided between the third conductive line TL3 and the fourth conductive line TL4. Specifically, the light emitting layer EL and the second electrode CE can be cut off by the groove H which is formed in the second inner dam DMI2.

When the light emitting layer EL and the second electrode CE are cut off, the third conductive line TL3 and the fourth conductive line TL4 are not electrically connected to each other. This is because the light emitting layer EL2 formed on the third conductive line TL3 and the light emitting layer EL3 formed on the fourth conductive line TL4 are separated and are not electrically connected to each other. This is also because the second electrode CE2 formed on the third conductive line TL3 and the second electrode CE3 formed on the fourth conductive line TL4 are separated and are not electrically connected to each other.

Since the second inner dam DMI2 formed of an insulating material is formed between the third conductive line TL3 and the fourth conductive line TL4, the third conductive line TL3 and the fourth conductive line TL4 are not electrically connected but are insulated from each other.

According to the embodiment of the present disclosure, it is possible to ascertain whether the light emitting layer EL and the second electrode CE have been cut off in the second inner dam DMI2 by measuring a current or resistance between the third test pad TPAD3 and the fourth test pad TPAD4.

Specifically, when the current between the third test pad TPAD3 and the fourth test pad TPAD4 is greater than a first threshold value or the resistance therebetween is equal to or less than a second threshold value, it can be determined that the light emitting layer EL and the second electrode CE are not cut off in the second inner dam DMI2.

The third test pad TPAD3 is electrically connected to the third conductive line TL3. The fourth test pad TPAD4 is electrically connected to the fourth conductive line TL4. When the current between the third test pad TPAD3 and the fourth test pad TPAD4 is greater than the first threshold value or the resistance therebetween is equal to or less than the second threshold value, it means that the third conductive line TL3 and the fourth conductive line TL4 are electrically connected to each other.

This means that the light emitting layer EL2 formed on the first side of the second inner dam DMI2 and the light emitting layer EL3 formed on the second side of the second inner dam DMI2 are not cut off and are electrically connected to each other. Alternatively, it means that the second electrode CE2 formed on the first side of the second inner dam DMI2 and the second electrode CE3 formed on the second side of the second inner dam DMI2 are not cut off and are electrically connected to each other.

On the other hand, when the current between the third test pad TPAD3 and the fourth test pad TPAD4 is equal to or less than the first threshold value or the resistance therebetween is greater than the second threshold value, it can be determined that the light emitting layer EL and the second electrode CE are cut off in the second inner dam DMI2.

When the current between the third test pad TPAD3 and the fourth test pad TPAD4 is equal to or less than the first threshold value or the resistance therebetween is greater than the second threshold value, it means that the third conductive line TL3 and the fourth conductive line TL4 are not electrically connected but are insulated from each other.

This means that the light emitting layer EL2 formed on the first side of the second inner dam DMI2 and the light emitting layer EL3 formed on the second side of the second inner dam DMI2 are cut off and are electrically insulated from each other. Alternatively, it means that the second electrode CE2 formed on the first side of the second inner dam DMI2 and the second electrode CE3 formed on the second side of the second inner dam DMI2 are cut off and are electrically insulated from each other.

In the display device according to the embodiment of the present disclosure, the light emitting layer EL and the second electrode CE are cut off by forming the groove H in the first inner dam DMI1 and the second inner dam DMI2. Accordingly, with the display device according to the embodiment of the present disclosure, it is possible to prevent moisture that may have permeated the side surfaces of the light emitting layer EL and the second electrode EC, which are exposed from the through-hole TH, from diffusing into the neighboring pixels P' disposed around the through-hole TH.

In the display device according to the embodiment of the present disclosure, since the first conductive line TL1 and the second conductive line TL2 are formed on the first side and the second side of the first inner dam DMI1, respectively, it is possible to easily ascertain whether the light emitting layer EL and the second electrode CE have been cut off in the inner dam DMI using the conductive lines. In the display device according to the embodiment of the present disclosure, since the third conductive line TL3 and the fourth conductive line TL4 are formed on the first side and the second side of the second inner dam DMI2, respectively, it is possible to easily ascertain whether the light emitting layer EL and the second electrode CE have been cut off in the inner dam DMI using the conductive lines. Accordingly, with the display device according to the embodiment of the present disclosure, it is possible to improve reliability of products.

The display device according to the embodiment of the present disclosure includes a through-hole TH penetrating a display panel in a display area. The through-hole TH has a structure from which elements for a display function and the substrate SUB are removed. Accordingly, various components can be installed or added to correspond to the through-hole TH.

A camera or an optical sensor can be disposed to correspond to the through-hole TH. A camera is located on the rear surface of the display panel and is disposed such that the center of the through-hole TH and the center of a lens of the camera match each other. When the camera is disposed on the rear surface of the display panel, the through-hole TH may not have a perfect hole shape. For example, a cover glass (not illustrated) can be bonded to the top surface of the encapsulation layer 130 in the display device using an optical adhesive. In this case, the through-hole TH is open on only the surface of the display device facing the camera and is clogged on the top surface which is watched by a user by the cover glass. Since most elements of the display panel other than the cover glass are removed from the front surface of the camera by the through-hole TH, imaging performance can be secured without being optically hindered.

Figure 10:
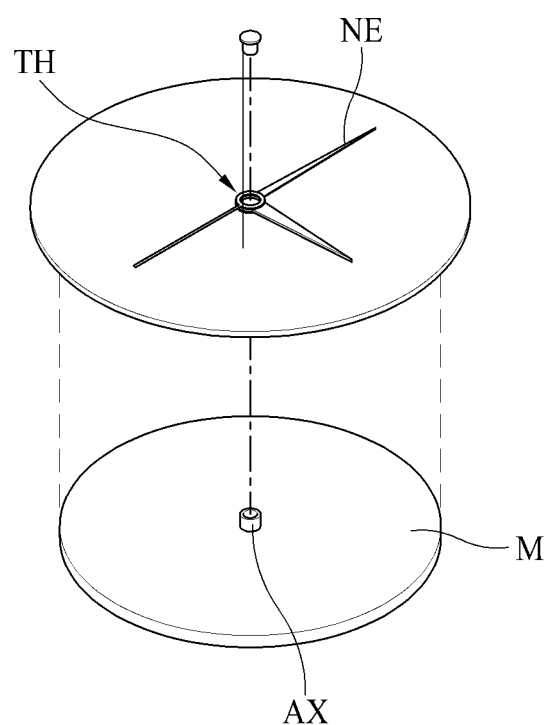
FIG. 10 is a diagram illustrating a timepiece employing a display device with a through-hole according to another embodiment of the present disclosure.

For example, as illustrated in FIG. 10, a drive shaft which is inserted into the through-hole TH can be further provided. For example, the display device with a through-hole according to the embodiment of the present disclosure can be applied to a timepiece. FIG. 10 is a diagram illustrating a timepiece employing the display device with a through-hole according to another embodiment of the present disclosure.

The display device with a through-hole according to the embodiment of the present disclosure can have a timepiece shape. The display device with the through-hole TH can display characters or numerals of a timepiece or various background pictures. A timepiece driving unit M is disposed on the rear surface of the display device. A drive shaft AX that drives hands of the timepiece NE is provided in the timepiece driving unit. The drive shaft AX protrudes from the front surface of the display device via the through-hole TH. The hands of the timepiece NE are mounted on the drive shaft AX protruding from the front surface of the display device. The hands of the timepiece NE include an hour hand, a minute hand, and a second hand which are mounted on the drive shaft AX passing through the through-hole TH.

The display device according to the exemplary embodiments of the present disclosure can be applied to various products such as a television, a notebook personal computer (PC), a monitor, a refrigerator, a microwave oven, a washing machine, and a camera in addition to mobile electronic devices such as an electronic notebook, an electronic book, a portable multimedia player (PMP), a navigation device, an ultra mobile PC (UMPC), a smartphone, a mobile communication terminal, a mobile phone, a tablet PC, a smart watch, a watch phone, and a wearable device.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

What is claimed is:

1. A display device comprising:
    a substrate including a display area in which pixels are disposed and a non-display area surrounding the display area, the display area including a through-hole;
    a first dam surrounding the through-hole;
    a first conductive line provided between the first dam and the pixels; and
    a second conductive line provided between the first dam and the through-hole,
    wherein each pixel includes:
        a first electrode provided over the substrate;
        a light emitting layer provided over the first electrode; and
        a second electrode provided over the light emitting layer, and
    wherein the light emitting layer is provided over the first conductive line and the second conductive line and is in contact with the first conductive line and the second conductive line.

2. The display device according to claim 1, wherein the first conductive line is electrically insulated from the second conductive line.

3. The display device according to claim 1, further comprising:
    a first test pad provided between the first dam and the through-hole and electrically connected to the first conductive line; and
    a second test pad provided between the first dam and the through-hole and electrically connected to the second conductive line.

4. The display device according to claim 3, further comprising:
    a first link line electrically connecting the first conductive line to the first test pad; and
    a second link line electrically connecting the second conductive line to the second test pad.

5. The display device according to claim 4, further comprising an insulating film provided between the first and second conductive lines and the substrate,
    wherein one end of the first link line is connected to the first conductive line via a first contact hole that penetrates the insulating film, and another end of the first link line is connected to the first test pad.

6. The display device according to claim 5, wherein one end of the second link line is connected to the second conductive line via a second contact hole that penetrates the insulating film, and another end of the second link line is connected to the second test pad.

7. The display device according to claim 1, wherein the light emitting layer and the second electrode are respectively cut off on the first dam.

8. The display device according to claim 7, wherein the first dam includes a groove, and
    wherein the light emitting layer and the second electrode are respectively cut off by the groove of the first dam.

9. The display device according to claim 7,
    wherein the light emitting layer provided over the first conductive line and the light emitting layer provided over the second conductive line are cut off from each other.

10. The display device according to claim 7, wherein the second electrode is provided over the first conductive line and the second conductive line, and
    wherein the second electrode provided over the first conductive line and the second electrode provided over the second conductive line are cut off from each other.

11. The display device according to claim 7, further comprising an encapsulation film provided over the second electrode,
    wherein the encapsulation film covers the second electrode, the first conductive line, the second conductive line, and the first dam.

12. The display device according to claim 1, wherein the first conductive line is in contact with a first side of the first dam and the second conductive line is in contact with a second side of the first dam.

13. The display device according to claim 1, wherein each of the first conductive line and the second conductive line has a closed shape.

14. The display device according to claim 13, wherein each of the first conductive line and the second conductive line has a ring shape.

15. The display device according to claim 1, further comprising a driving transistor provided over the substrate, the driving transistor including a gate electrode, a source electrode, and a drain electrode,
    wherein each of the first conductive line and the second conductive line is provided in the same layer as at least one of the gate electrode, the source electrode, and the drain electrode.

16. The display device according to claim 1, further comprising:
    a second dam provided between the first dam and the through-hole and surrounding the through-hole;
    a third conductive line provided along the second dam between the second dam and the first dam; and
    a fourth conductive line provided along the second dam between the second dam and the through-hole,
    wherein the third conductive line is electrically insulated from the fourth conductive line.

17. The display device according to claim 16, further comprising:
    a third test pad provided between the second dam and the through-hole and electrically connected to the third conductive line; and
    a fourth test pad provided between the second dam and the through-hole and electrically connected to the fourth conductive line.

18. The display device according to claim 17, further comprising:
    a third link line electrically connecting the third conductive line to the third test pad; and
    a fourth link line electrically connecting the fourth conductive line to the fourth test pad.

19. The display device according to claim 18, further comprising an insulating film provided between the third and fourth conductive lines and the substrate,
- wherein one end of the third link line is connected to the third conductive line via a third contact hole that penetrates the insulating film and another end of the third link line is connected to the third test pad, and
- wherein one end of the fourth link line is connected to the fourth conductive line via a fourth contact hole that penetrates the insulating film and another end of the fourth link line is connected to the fourth test pad.

\* \* \* \* \*